(12) United States Patent
Ishizu et al.

(10) Patent No.: US 10,388,364 B2
(45) Date of Patent: Aug. 20, 2019

(54) MEMORY DEVICE, DRIVING METHOD THEREOF, SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takahiko Ishizu, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/695,128

(22) Filed: Sep. 5, 2017

(65) Prior Publication Data

US 2018/0075900 A1    Mar. 15, 2018

(30) Foreign Application Priority Data

Sep. 12, 2016  (JP) .................................. 2016-177842
Mar. 15, 2017  (JP) .................................. 2017-050193

(51) Int. Cl.
*G11C 7/14*         (2006.01)
*G11C 11/419*    (2006.01)
(Continued)

(52) U.S. Cl.
CPC .............. *G11C 11/419* (2013.01); *G11C 7/14* (2013.01); *G11C 7/227* (2013.01); *G11C 11/404* (2013.01);
(Continued)

(58) Field of Classification Search
CPC ....................................................... G11C 7/14
See application file for complete search history.

(56) References Cited

U.S. PATENT DOCUMENTS 6,127,702 A    10/2000  Yamazaki et al.
6,285,589 B1 *  9/2001  Kajitani .............. G11C 11/5621
                                                                  365/185.19
(Continued)

FOREIGN PATENT DOCUMENTS

JP    11-016344 A    1/1999
JP    11-162164 A    6/1999
(Continued)

OTHER PUBLICATIONS

Inoue.H et al., "Nonvolatile Memory With Extremely Low-Leakage Indium-Gallium-Zinc-Oxide Thin-Film Transistor", IEEE Journal of Solid-State Circuits, Sep. 1, 2012, vol. 47, No. 9, pp. 2258-2265.
(Continued)

*Primary Examiner* — Amir Zarabian
*Assistant Examiner* — Jay W. Radke
(74) *Attorney, Agent, or Firm* — Fish & Richardson P.C.

(57) ABSTRACT

A memory device includes a memory cell, a replica cell, a read circuit, a write wordline, a read wordline, a dummy read wordline, a write bitline, a read bitline, a reference bitline, a sourceline, and a first wiring. The memory cell is electrically connected to the write wordline, the read wordline, the write bitline, the read bitline, and the sourceline. The read circuit outputs a potential based on the result of comparing the potential of the reference bitline and the potential of the read bitline. The replica cell includes a first transistor and a second transistor. The first transistor and the second transistor are electrically connected to each other in series between the bitline and the sourceline. A gate of the first transistor and a gate of the second transistor are electrically connected to a dummy read wordline and the first wiring, respectively.

8 Claims, 28 Drawing Sheets

(51) Int. Cl.

| | | |
|---|---|---|
| *G11C 7/22* | (2006.01) | |
| *G11C 16/04* | (2006.01) | |
| *G11C 16/24* | (2006.01) | |
| *G11C 16/28* | (2006.01) | |
| *H01L 27/11529* | (2017.01) | |
| *G11C 11/404* | (2006.01) | |
| *G11C 11/4091* | (2006.01) | |
| *G11C 11/4099* | (2006.01) | |
| *H01L 29/786* | (2006.01) | |
| *G11C 7/06* | (2006.01) | |
| *H01L 27/1156* | (2017.01) | |

(52) U.S. Cl.
CPC ...... *G11C 11/4091* (2013.01); *G11C 11/4099* (2013.01); *G11C 16/0425* (2013.01); *G11C 16/24* (2013.01); *G11C 16/28* (2013.01); *H01L 27/11529* (2013.01); *H01L 29/7869* (2013.01); *G11C 7/065* (2013.01); *H01L 27/1156* (2013.01)

(56) References Cited

U.S. PATENT DOCUMENTS

| | | | |
|---|---|---|---|
| 7,375,399 | B2 | 5/2008 | Ishii et al. |
| 8,339,828 | B2 | 12/2012 | Yamazaki et al. |
| 8,363,452 | B2 | 1/2013 | Yamazaki et al. |
| 8,659,941 | B2 | 2/2014 | Kamata et al. |
| 8,896,042 | B2 | 11/2014 | Yamazaki et al. |
| 2002/0136074 | A1 | 9/2002 | Hanzawa et al. |
| 2005/0047218 | A1 | 3/2005 | Kirihata et al. |
| 2006/0164876 | A1 | 7/2006 | Barth et al. |
| 2010/0148171 | A1 | 6/2010 | Hayashi et al. |
| 2011/0089417 | A1 | 4/2011 | Yamazaki et al. |
| 2011/0101351 | A1 | 5/2011 | Yamazaki |
| 2011/0110145 | A1* | 5/2011 | Yamazaki ............ G11C 11/405 365/149 |
| 2012/0294070 | A1 | 11/2012 | Matsuzaki et al. |
| 2014/0375865 | A1* | 12/2014 | Shroff ................ G06T 5/00 348/333.12 |

FOREIGN PATENT DOCUMENTS

| | | |
|---|---|---|
| JP | 2001-053167 A | 2/2001 |
| JP | 2002-245775 A | 8/2002 |
| JP | 2006-012878 A | 1/2006 |
| JP | 2011-119675 A | 6/2011 |
| JP | 2013-008435 A | 1/2013 |
| KR | 2002-0067406 A | 8/2002 |
| WO | WO-2005/031857 | 4/2005 |

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

International Search Report (Application No. PCT/IB2017/055164) dated Dec. 19, 2017.

Written Opinion (Application No. PCT/IB2017/055164) dated Dec. 19, 2017.

\* cited by examiner

<Write Operation>

<Read Operation>

<Write Operation>

FIG. 15

| Operation frequency [MHz] | Generation method of read judge potential | | | |
|---|---|---|---|---|
| | Embodiment Replica cell | | Comparison example External input (0.4V) | |
| | Typical case | Worst case | Typical case | Worst case |
| 50 | PASS | PASS | PASS | PASS |
| 67 | PASS | PASS | PASS | PASS |
| 80 | PASS | PASS | PASS | FAIL |
| 100 | PASS | FAIL | PASS | FAIL |
| 125 | PASS | FAIL | PASS | FAIL |
| 150 | FAIL | FAIL | FAIL | FAIL |

FIG. 27

| Read scheme | Conventional (External voltage) | | | | Example 1 (Replica cell) | | | |
|---|---|---|---|---|---|---|---|---|
| Process | Typical | Slow | Slow | Fast | Typical | Slow | Slow | Fast |
| Voltage | 0% | -10% | -10% | +10% | 0% | -10% | -10% | +10% |
| Temparature | 27℃ | 85℃ | -40℃ | 85℃ | 27℃ | 85℃ | -40℃ | 85℃ |
| Tsns 5.0ns | Pass | Pass | Pass | Pass | Pass | Pass | Pass | Pass |
| 4.5ns | Pass | Pass | Pass | Pass | Pass | Pass | Pass | Pass |
| 4.0ns | Pass | Pass | Pass | Pass | Pass | Pass | Pass | Pass |
| 3.5ns | Pass | Pass | Pass | Pass | Pass | Pass | Pass | Pass |
| 3.0ns | Pass | Pass | Pass | Pass | Pass | Pass | Pass | Pass |
| 2.5ns | Pass | Fail | Pass | Pass | Pass | Pass | Pass | Pass |
| 2.0ns | Pass | Fail | Fail | Pass | Pass | Pass | Pass | Pass |
| 1.5ns | Pass | Fail | Fail | Pass | Pass | Pass | Pass | Pass |
| 1.0ns | Fail | Fail | Fail | Fail | Pass | Fail | Fail | Pass |
| 0.5ns | Fail | Fail | Fail | Fail | Fail | Fail | Fail | Fail |

FIG. 28A
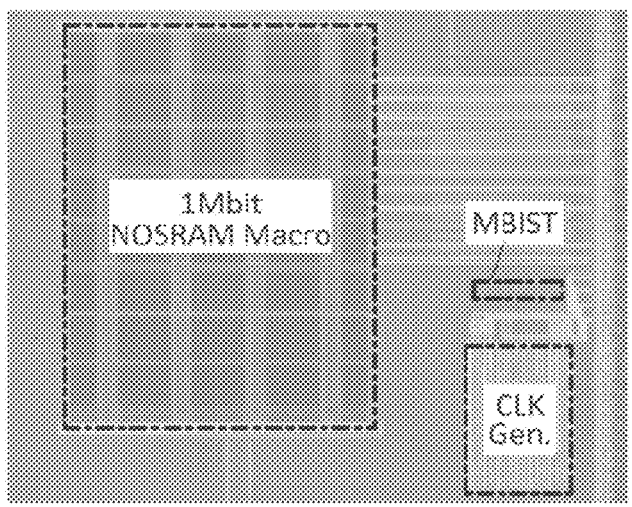
FIG. 28B
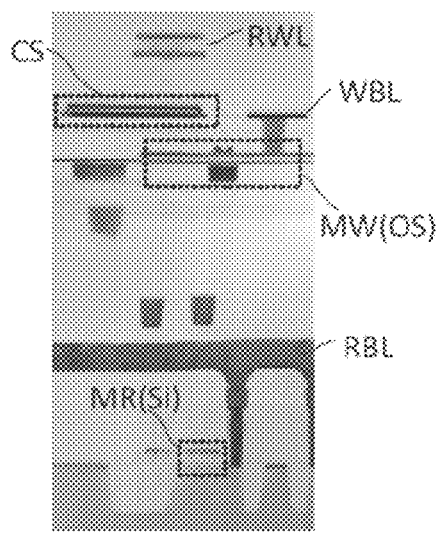
FIG. 28C
| Technology | 65nm CMOS + 60nm OS with 1P9M BEOL |
|---|---|
| Organization | 1 Mbit (32 K words ×32 bits) |
| Supply voltage | VDD: Core logic (1.2 V) |
| | VWL: Word line high voltage (3.3 V) |
| | VSL: Source line high voltage (1.6 V) |
| MAX. frequency | 140 MHz @RT |
| Active power | Write: 64 $\mu$W/MHz |
| | Read: 56 $\mu$W/MHz |
| Static power | 31 $\mu$W in standby state |
| Retention time | > 1 h at 85°C |
| Bit density for a 64kbit subarray | 0.57 Mb/mm$^2$ |
| Cell size | 0.9906 $\mu$m$^2$ |

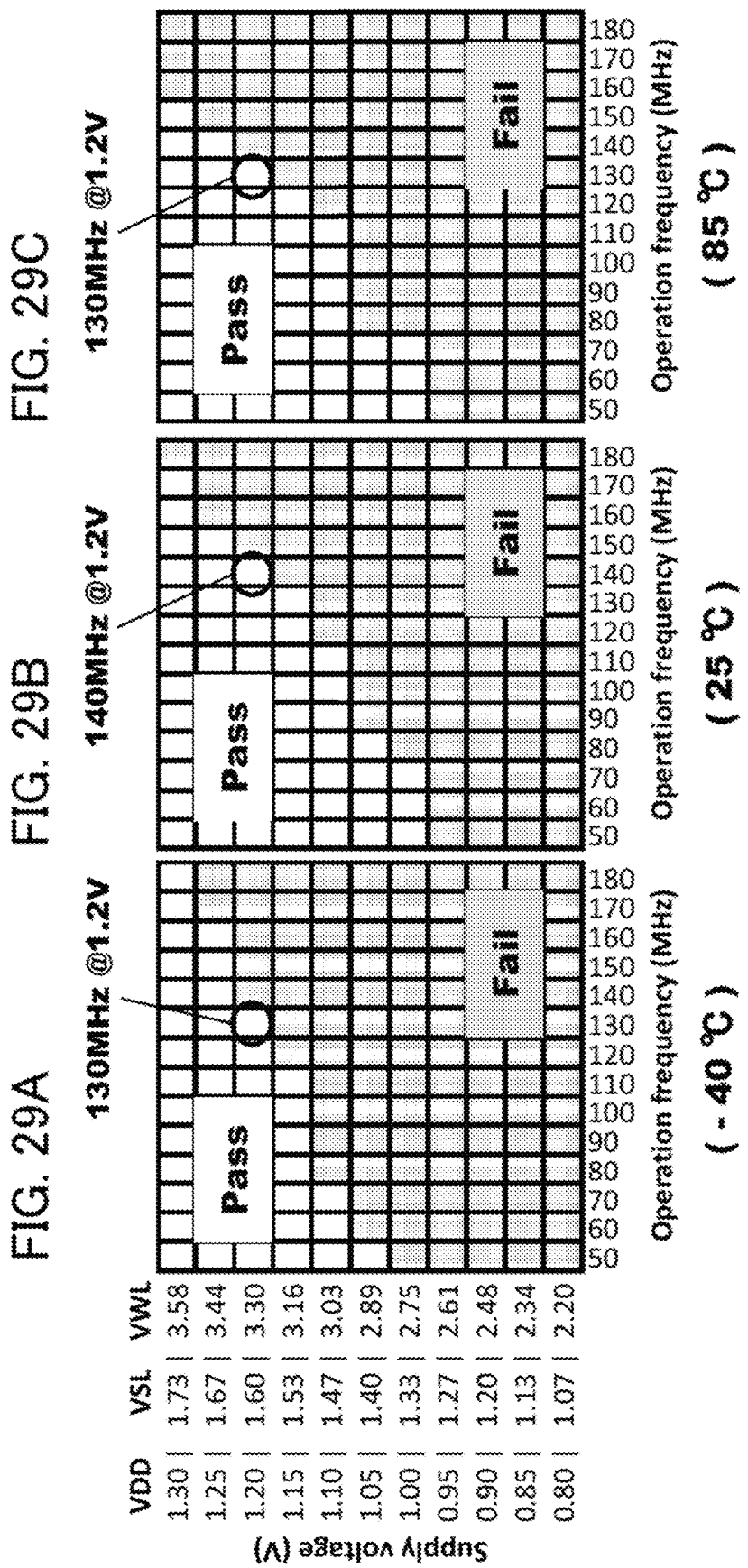

MEMORY DEVICE, DRIVING METHOD THEREOF, SEMICONDUCTOR DEVICE, ELECTRONIC COMPONENT, AND ELECTRONIC DEVICE

TECHNICAL FIELD

One embodiment of the present invention disclosed in the specification, the drawings, and the claims (hereinafter referred to as "this specification and the like") relates to a memory device, a driving method thereof, and a manufacturing method thereof. Note that one embodiment of the present invention is not limited to the technical field.

BACKGROUND ART

In a general dynamic random access memory (DRAM), a memory cell includes one transistor (1T) and one capacitor (1C). Such a 1T1C DRAM is a memory capable of retaining data by accumulating electric charge in a capacitor and thus has no limit on the number of times of writing in principle. As a high-capacity memory device, the DRAM is incorporated in a number of electronic devices because of writing and reading at high speed and a small number of elements in memory cells, which easily enable high integration. The 1T1C DRAM performs data reading in such a manner that electric charge accumulated in the capacitor is released to a bitline and a change in a potential is measured; therefore, the electrostatic capacitance of the capacitor needs to be kept at a certain value or more. As a result, miniaturization of its memory cell makes it more and more difficult to keep necessary electrostatic capacitance.

A gain cell including two or three transistors has been proposed (e.g., Patent Documents 1 and 2). In the gain cell, the amount of electric charge can be amplified by a read transistor and the electric charge can be supplied to a bitline; therefore, it is possible to reduce the capacitance of the capacitor.

A transistor including a metal oxide in a channel formation region (hereinafter, such a transistor may be referred to as a metal oxide semiconductor transistor or an OS transistor) is known. For example, a memory device in which a write transistor of a gain cell is an OS transistor is disclosed in Patent Document 3 and Non-Patent Document 1.

In this specification and the like, a memory which is provided with an OS transistor in a memory cell, as described in Patent Document 3, is referred to as an OS memory. As in Non-Patent Document 1, a gain-cell DRAM in which a write transistor is an OS transistor is referred to as "NOSRAM (registered trademark)". "NOSRAM" is short for nonvolatile oxide semiconductor RAM.

REFERENCE

Patent Document

[Patent Document 1] Japanese Published Patent Application No. 2001-53167
[Patent Document 2] Japanese Published Patent Application No. 2006-012878
[Patent Document 3] Japanese Published Patent Application No. 2011-119675

Non-Patent Document

[Non-Patent Document 1] H. Inoue, et al., "Nonvolatile Memory With Extremely Low-Leakage Indium-Gallium-Zinc-Oxide Thin-Film Transistor," IEEE J. Solid-State Circuits, September 2012, vol. 47, no. 9, pp. 2258-2265.

DISCLOSURE OF INVENTION

An object of one embodiment of the present invention is to increase the resistance to PVT (Process/Voltage/Temperature) variations, to optimize a read judge potential used for data reading, to increase the reading speed, or to increase the operation frequency.

One embodiment of the present invention does not necessarily achieve all the objects described above. The description of a plurality of objects does not preclude their coexistence. Other objects will be apparent from the description of this specification and the like, and such objects could be objects of one embodiment of the present invention.

(1) One embodiment of the present invention is a memory device comprising a memory cell, a replica cell, a read circuit, a write wordline, a read wordline, a dummy read wordline, a write bitline, a read bitline, a reference bitline, a sourceline, and a first wiring. The replica cell includes a first transistor and a second transistor. A gate, a first terminal, and a second terminal of the first transistor are electrically connected to the dummy read wordline, the reference bitline, and a first terminal of the second transistor, respectively. A gate and a second terminal of the second transistor are electrically connected to the first wiring and the sourceline, respectively. The memory cell includes a third transistor, a fourth transistor, and a capacitor. A gate, a first terminal, and a second terminal of the third transistor are electrically connected to the write wordline, the write bitline, and a gate of the fourth transistor, respectively. A first terminal and a second terminal of the capacitor are electrically connected to the gate of the fourth transistor and the read wordline, respectively. A first terminal and a second terminal of the fourth transistor are electrically connected to the sourceline and the read bitline, respectively. The first transistor, the second transistor, and the fourth transistor are the same in conductivity type. The read circuit compares a potential of the reference bitline and a potential of the read bitline and outputs a potential based on the comparison result.

(2) In the embodiment (1), a bitline is included instead of the write bitline and the read bitline, and the first terminal of the third transistor and the second terminal of the fourth transistor are electrically connected to the bitline.

(3) In the embodiment (1) or (2), a channel formation region of the third transistor includes a metal oxide.

(4) One embodiment of the present invention is a method for driving the memory device according to the embodiment (1) or (2) in which when the read circuit is inactive, to activate the read circuit, the read wordline is selected to turn on the third transistor, and the dummy read wordline is selected to turn on the first transistor.

In this specification and the like, ordinal numbers such as "first", "second", and "third" are used to avoid confusion among components, and the terms do not limit the components numerically or do not limit the order.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y are each assumed to be an object (e.g., a device, an element, a circuit, a wiring, an electrode, a terminal, a conductive film, or the like).

A transistor includes three terminals: a gate, a source, and a drain. A gate is a terminal which functions as a control terminal for controlling the conduction state of a transistor. Functions of input/output terminals of the transistor depend on the type and the levels of potentials applied to the terminals, and one of the two terminals serves as a source and the other serves as a drain. Therefore, the terms "source" and "drain" can be switched in this specification and the like. In this specification and the like, the two input/output terminals other than the gate may be referred to as a first terminal and a second terminal.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

A voltage usually refers to a potential difference between a given potential and a reference potential (e.g., a ground potential or a source potential). Thus, a voltage can be referred to as a potential and vice versa. Note that the potential indicates a relative value. Accordingly, "ground potential" does not necessarily mean 0 V.

In this specification and the like, the terms "film" and "layer" can be interchanged depending on the case or circumstances. For example, in some cases, the term "conductive layer" can be used instead of the term "conductive film", and the term "insulating film" can be used instead of the term "insulating layer".

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an electronic device, and the like themselves might be semiconductor devices, or might each include a semiconductor device.

Note that in this specification and the like, a metal oxide means an oxide of metal in a broad sense. Metal oxides are classified into an oxide insulator, an oxide conductor (including a transparent oxide conductor), an oxide semiconductor, and the like. For example, a metal oxide used in a channel formation region of a transistor is referred to as an oxide semiconductor in some cases.

In this specification and the like, a metal oxide containing nitrogen is used in a channel formation region of a transistor, unless otherwise specified. Moreover, a metal oxide containing nitrogen may be referred to as a metal oxynitride. Moreover, a metal oxide including nitrogen may be called a metal oxynitride.

According to one embodiment of the present invention, it is possible to increase the resistance to PVT (Process/Voltage/Temperature) variations, to optimize a read judge potential used for data reading, to increase the reading speed, or to increase the operation frequency.

In one embodiment of the present invention, there is no need to achieve all the effects described above. Note that the description of the plurality of effects does not disturb the existence of other effects. In one embodiment of the present invention, an object other than the above objects, an effect other than the above effects, and a novel feature will be apparent from the description of the specification and the drawings.

BRIEF DESCRIPTION OF DRAWINGS

FIG. 15 shows the relationship between a generation method of a read judge potential and an operation frequency of a NOSRAM.

FIG. 27 shows simulation results of the reading speed between the conventional read scheme and a read scheme in Example 1.

FIG. 28A is a die micrograph of a fabricated NOSRAM. FIG. 28B is a cross-sectional micrograph of a memory cell. FIG. 28C shows specifications of the NOSRAM.

FIGS. 29A to 29C show Shmoo plot (Voltages VDD, VSL, and VWL vs operation frequency in the temperature ranges of (A) −40° C., (B) 25° C., and (C) 85° C.).

BEST MODE FOR CARRYING OUT THE INVENTION

Figure 1:
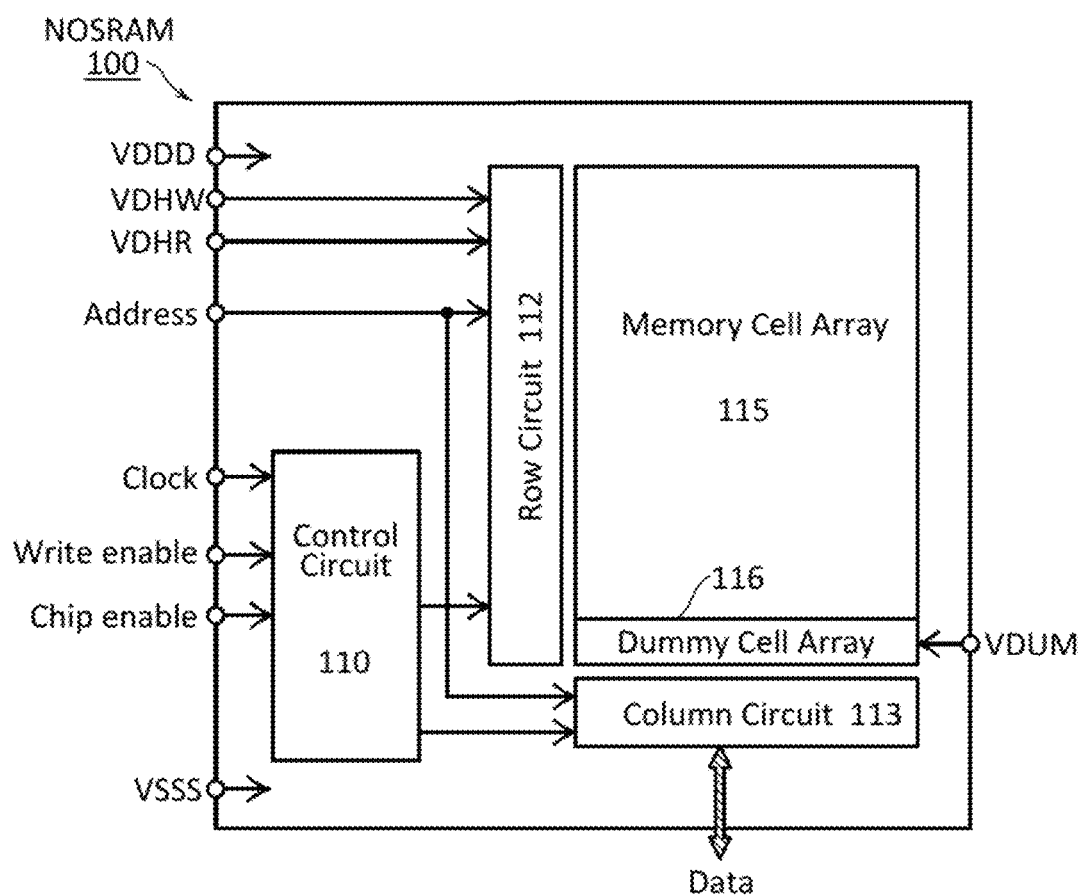
FIG. 1 is a block diagram showing a configuration example of a NOSRAM.

Hereinafter, an embodiment of the present invention will be described. It will be readily appreciated by those skilled in the art that modes and details of the present invention can be modified in various ways without departing from the spirit and scope of the present invention. One embodiment of the present invention therefore should not be construed as being limited to the following description of the embodiments and the example.

Any of the embodiments and the example described below can be combined as appropriate. In addition, in the case where a plurality of structure examples (including a manufacturing method example, an operating method example, a usage example, and the like) are given in one embodiment, any of the structure examples can be combined as appropriate, and any of the structure examples can be combined with one or more structure examples described in the other embodiments and the example.

In the drawings, the same elements, elements having similar functions, elements formed of the same material, elements formed at the same time, and the like are sometimes denoted by the same reference numerals, and the description thereof is not repeated in some cases.

In the drawings, the size, the layer thickness, the region, or the like is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

Embodiment 1

In this embodiment, a memory device including a gain memory cell will be described. A NOSRAM is describe here as an example of such a memory cell.

<<NOSRAM>>

FIG. 1 is a block diagram showing a configuration example of a NOSRAM. A NOSRAM 100 includes a control circuit 110, a row circuit 112, a column circuit 113, a memory cell array 115, and a replica cell array 116. Potentials VDDD, VSSS, VDUM, VDHW, VDHR, a clock signal, an address signal, a chip enable signal, and a write enable signal are input from the outside to the NOSRAM 100.

The control circuit 110 has a function of controlling the entire operation of the NOSRAM 100. For example, the control circuit 110 conducts a logic operation of a chip enable signal and a write enable signal and determines whether access from the outside is write access or read access.

The row circuit 112 has a function of selecting a wordline of a row specified by an address signal. The column circuit 113 has a function of writing and reading data to and from a bitline of a column specified by an address signal.

<Memory Cell Array and Replica Cell Array>

Figure 2:
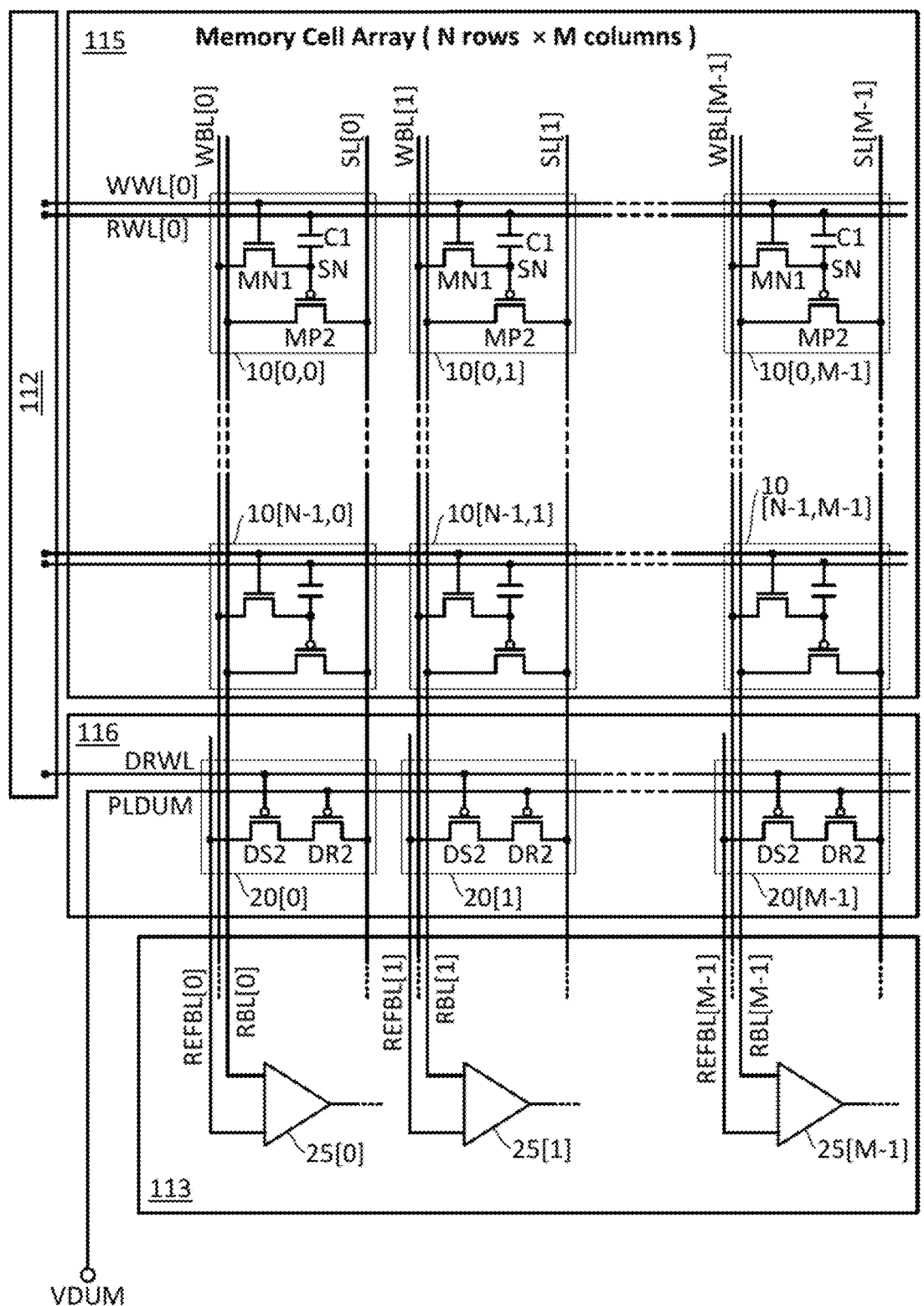
FIG. 2 is a circuit diagram showing a configuration example of a memory cell array.

FIG. 2 shows a configuration example of the memory cell array 115 and the replica cell array 116. The memory cell array 115 includes memory cells 10, wordlines WWL and RWL, bitlines WBL and RBL, and a sourceline SL. The wordlines WWL and RWL are a write wordline and a read wordline, respectively. The bitlines WBL and RBL are a write bitline and a read bitline, respectively.

The memory cells 10 are arranged in an array of N rows and M columns (N and M are each an integer greater than 0). The wordlines WWL and RWL, the bitlines WBL and RBL, and the sourceline SL are provided in accordance with the arrangement of the memory cells 10. The wordlines WWL and RWL are electrically connected to the row circuit 112. The bitlines WBL and RBL and the sourceline SL are electrically connected to the column circuit 113.

Note that in this specification and the like, the row number is counted from not 1 but 0. The same applies to the column number. For example, a bitline RBL[0] represents a read bitline in a 0-th row. A memory cell 10[0,1] represents a memory cell 10 in the 0-th row and a first column.

In this specification, when any one of the bitlines needs to be specified among a plurality of bitlines RBL, the one is referred to as a bitline RBL[0], for example. In addition, "the bitline RBL" represents a given bitline RBL. The same applies to other elements.

Each of the memory cells 10 in the example of FIG. 2 is a 2T1C gain cell. The memory cell 10 includes a node SN, transistors MN1 and MP2, and a capacitor C1. The transistors MN1 and MP2 are a write transistor and a read transistor, respectively. The capacitor C1 is a storage capacitor for holding the voltage of the node SN.

The transistor MN1 is an OS transistor. There is no particular limitation on the type of the transistor MP2. A Si transistor is typically used as the transistor MP2. The memory cell 10 can hold data for a long time because the write transistor (the transistor MN1) is an OS transistor.

As compared to a gain cell DRAM including a Si transistor, the retention time of a NOSRAM can be much increased. Therefore, the frequency of refresh operation can be reduced, whereby power needed for refresh operations can be reduced.

A metal oxide semiconductor has a bandgap of 2.5 eV or higher or 3.0 eV or higher; thus, an OS transistor has low leakage current due to thermal excitation and, as described above, extremely low off-state current. The off-state current of the OS transistor normalized by channel width can be reduced to a range of approximately a few yA per μm to a few zA per μm. Thus, when the OS transistor is used as the write transistor, leakage of charge from the capacitor C1 can be prevented, so that the retention time of the memory cell 10 can be increased. For example, the retention time at 85° C. can be 1 to 10 years.

Examples of metal oxides that can be used in the channel formation region of an OS transistor include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn or Hf). In addition, an oxide containing indium and zinc may contain one or more chosen from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

The replica cell array 116 includes M replica cells 20, a wordline DRWL, M bitlines REFBL, and a wiring PLDUM. The wordline DRWL is a dummy read wordline for replica cells and driven by the row circuit 112. The bitline REFBL is a reference read bitline for inputting a read judge potential to the column circuit 113. The read judge potential is a reference potential for judging whether data written to the bitline RBL is "0" or "1". The wiring PLDUM is a power supply line for inputting the potential VDUM to the replica cell array 116.

The replica cells 20 are arranged in one row and M column. Each of the replica cells 20 includes transistors DR2 and DS2. The reason why the transistors DR2 and DS2 are p-channel transistors is that the read transistor MP2 of the memory cell 10 is a p-channel transistor.

The transistors DR2 and DS2 are electrically connected to each other in series between the bitline REFBL and the sourceline SL. The transistors DR2 and DS2 are a read transistor and a selection transistor of a 3T gain cell, respectively. In the replica cell 20, a gate of the transistor DR2 is electrically connected to the wiring PLDUM instead of a retention node, and a gate of the transistor DS2 is electrically connected to the wordline DRWL.

The row circuit 113 includes a read circuit 25 in each row. The bitlines RBL and REFBL are electrically connected to the read circuit 25. The read circuit 25 compares the potential of the bitline RBL and the potential of the bitline REFBL and outputs a potential based on the comparison result. A sense amplifier (typically a latch sense amplifier), a differential amplifier, or the like can be used for the read circuit 25.

<<Operation Example of NOSRAM>>

Figures 3A, 3B:
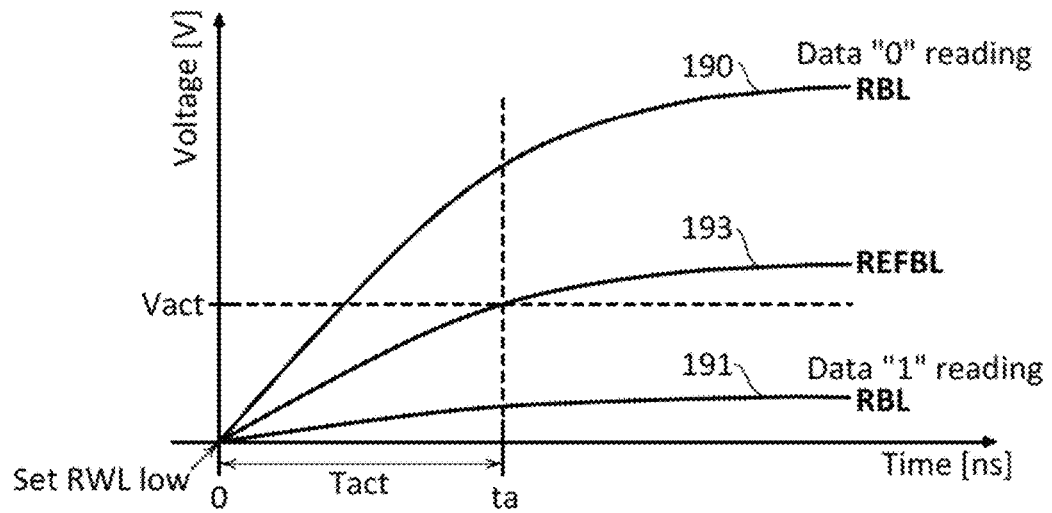
FIG. 3A is a timing chart showing an operation example of a NOSRAM.
FIG. 3B shows an example of a method for sensing data read by a bitline.

An operation example of the NOSRAM 100 is described with reference to FIG. 3A. FIG. 3A is a timing chart showing the operation example of the NOSRAM 100. The potential VDDD is a high-level-side power supply potential and represents data "1". The potential VSSS is a low-level-side power supply potential and represents data "0". The potential VDHW is a high level potential of the wordline WWL. The potential VDHR is a high level potential of the wordlines RWL and DRWL.

(Power-Off)

In the power-off state, the potential of wirings such as the bitline WBL is VSSS.

(Standby)

When power is on and the chip enable signal is "L" (low level), the NOSRAM 100 is in the standby state. The wordline WWL is "L". The wordlines RWL and DRWL are "H" (high level). The transistors MN1 and MP2 of the memory cell 10 and the transistor DS2 of the replica cell 20 are in the off state.

(Write)

When the chip enable signal "H" and the write enable signal "H" are input, the NOSRAM 100 starts the write operation. The wordlines WWL and RWL of the row selected by the row circuit 112 become "H" and "L", respectively. A potential based on data is input to the bitline WBL selected by the column circuit 113. The potential of the node SN of the selected memory cell 10 becomes VDDD when data "1" is written, and becomes VSSS when data "0" is written.

(Read)

When the chip enable signal "H" and the write enable signal "L" are input, the NOSRAM 100 starts the read operation. The sourceline SL selected by the column circuit 113 becomes "H", and then, the wordline RWL selected by the row circuit 112 becomes "L". When the node SN holds data "0", the transistor MP2 is in the on-state; thus, the bitline RBL is charged by the source-drain current (hereinafter referred to as drain current) of the transistor MP2, so that the potential of the bitline RBL is increased. When the node SN holds data "1", the transistor MP2 is kept in the off-state; thus, the potential of the bitline RBL is hardly changed.

At the same time the wordline RWL is set to "L", the wordline DRWL is also set to "L" to turn on the transistor DS2 of the replica cell 20. The bitline REFBL is charged by the drain current of the transistor DR2. In other words, the potential of the bitline REFBL is changed in response to a signal generated by the replica cell 20.

The read circuit 25 is activated while the wordline RWL is selected. The read circuit 25 judges whether the potential of the bitline RBL corresponds to data "0" or "1" on the basis of the potential of the bitline REFBL, and outputs a signal having a potential based on the judgment result. The principle of data reading is described with reference to FIG. 3B.

FIG. 3B schematically shows a potential change of the bitlines RBL and REFBL from the time when the wordline RWL is set to "L". A curved line 190 shows a potential change of the bitline RBL when data "0" is read. A curved line 191 shows a potential change of the bitline RBL when data "1" is read. A curved line 193 shows a potential change of the bitline REFBL. In FIG. 3B, ta represents time of the activation of the read circuit 25, and Tact represents time between the selection of the wordline RWL and the activation of the read circuit 25.

The read circuit 25 performs 0/1 judgment of data read from the memory cell 10 at the time ta. The judgment is performed using the magnitude relation between the potential of the bitline RBL and the potential Vact of the bitline REFBL. In the example of FIG. 3B, when the potential of the bitline RBL is larger than Vact, the read circuit 25 outputs data "0", whereas when the potential of the bitline RBL is smaller than or equal to Vact, the read circuit 25 outputs data "1".

The replica cell 20 included in the NOSRAM 100 generates a read judge potential as described above, which can increase the resistance to PVT (Process/Voltage/Temperature) variations of the NOSRAM 100. This is understood by comparison between the NOSRAM 100 and the comparison example in which the read judge potential is a fixed potential input from the outside.

When the transistor characteristics of the NOSRAM 100 are varied or the temperature environment is changed, the curve lines 190 and 191 shown in FIG. 3B are changed. Since the read judge potential is fixed in the comparison example, it is necessary to determine the time Tact assuming that the transistor characteristics are poorer than the specification. Therefore, the time Tact is increased when the margin of a charge time of the bitline RBL is considered. As a result, owing to the fixed read judge potential (e.g., VDDD/2), signal control is easy but reading speed is limited in the comparison example.

In contrast, a read judge potential is generated inside the NOSRAM 100, the read judge potential can follow a variation in transistor characteristics and temperature change. For example, the value of the read judge potential can be reduced when the transistor characteristics are at a slow process corner, while the value of the read judge potential can be increased when the transistor characteristics are at a fast process corner.

The read judge potential of the NOSRAM 100 can be optimized by adjustment of the size (typically, channel length L and channel width W) of the transistors DR2 and DS2 of the replica cell 20 and the level of the potential VDUM. Examples are shown below.

The L and W of the transistor DR2 are the same as those of the transistor MP2 of the memory cell 10. When the specifications of the transistor DR2 and the transistor MP2 are the same, the design and fabrication process become easy.

The value of the potential VDUM is determined in consideration of the threshold voltage of the transistor DR2. For example, the value of the potential VDUM is a value intermediate between the potential of data "0" (VSSS) and the potential of data "1" (VDDD).

The current drive capability of the transistor DS2 is higher than that of the transistor DR2. This is because the charge time of the bitline REFBL in the read operation is determined depending on the current drive capability of the transistor DR2. As a result, a change in potential of the bitline REFBL in the read operation can be easily controlled by the value of the potential VDUM. To increase the current drive capability of the transistor DS2, for example, the W of the transistor DS2 is set larger than that of the transistor DR2.

The size of the transistors DR2 and DS2 and the determination method of the potential VDUM are not limited to the above. The size of the transistors DR2 and DS2 and the potential VDUM are preferably determined so that in the read operation, the potential of the bitline REFBL varies while being a value intermediate between the potential of the bitline RBL when data "0" is written and the potential of the bitline RBL when data "1" is written.

Although a cell for generating a read judge potential is referred to as replica cell in this embodiment, it may be referred to as dummy cell, for example. Another configuration example of the replica cell is described below with reference to FIGS. 4A to 4C.

<Replica Cell>

Figure 4A:
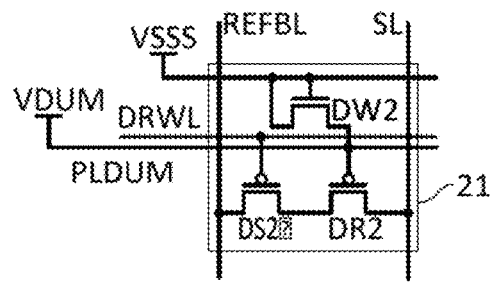
FIGS. 4A to 4C are circuit diagrams showing structure examples of a replica cell.

A replica cell 21 shown in FIG. 4A is a modification example of the replica cell 20 and further includes a transistor DW2. The transistor DW2 is an OS transistor. A gate and a first terminal of the transistor DW2 are electrically connected to a power supply line supplying the potential VSSS. A second terminal thereof is electrically connected to a gate of the transistor DR2. The transistor DW2 is a transistor having the same size as the transistor MN1 of the memory cell 10. The transistor DW2 is a read transistor of a gain cell. Including the transistor DW2, the replica cell 21 has a circuit configuration closer to the memory cell 10 rather than the replica cell 20.

Figure 4B:
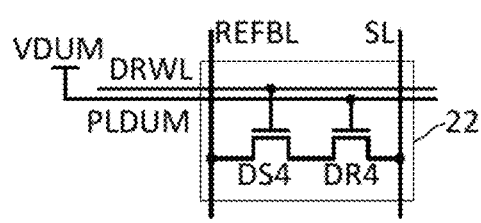
Figure 4C:
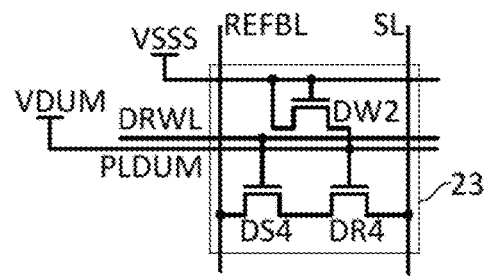

A replica cell 22 shown in FIG. 4B includes transistors DS4 and DR4. The replica cell 22 is a modification example of the replica cell 20 and has a configuration in which a read transistor and a selection transistor are n-channel transistors. A replica cell 23 shown in FIG. 4C is a modification example of the replica cell 21 and includes transistor DS4 and DR4 instead of the transistors DR2 and DS2.

<Memory Cell and Memory Cell Array>

Other configuration examples of the memory cell and memory cell array are described with reference to FIGS. 5A to 5D and FIGS. 6A to 6C.

Figure 5A:
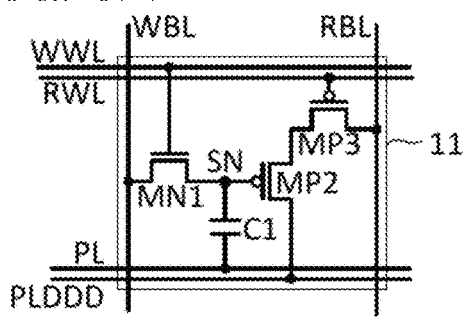
FIGS. 5A to 5D are circuit diagrams showing a memory cell array and structure examples of a memory cell array.

A memory cell 11 illustrated in FIG. 5A is a 3T gain cell and corresponds to the memory cell 10 to which a transistor MP3 is added. In the memory cell 11, the capacitor C1, the transistor MP2, and the transistor MP3 are electrically connected to the wiring PL, the wiring PLDDD, and the read bitline RBL, respectively. A fixed potential (e.g., VDDD) is input to the wiring PL. The wiring PLDDD is a power supply line for the potential VDDD.

When the memory cell 11 is included in a memory cell array, the replica cell 20 or 21 can be included in a replica cell array. In that case, the memory cell array cannot include the sourceline SL, and thus the replica cell 20 (or 21) is electrically connected to the wiring PLDDD instead of the sourceline SL.

Figure 5B:
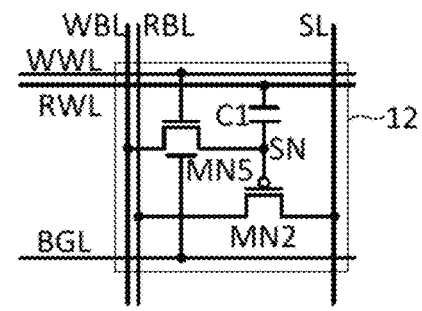

A memory cell 12 illustrated in FIG. 5B is another modification example of the memory cell 10 and includes a transistor MN5 having a backgate, instead of the transistor MN1. The backgate of the transistor MN5 is electrically connected to a wiring BGL. A fixed potential may be input to the wiring BGL. The potential of the wiring BGL may be changed in response to the operation of the NOSRAM 100. The transistor MN1 of the memory cell 11 may be changed to the transistor MN5.

Figure 5C:
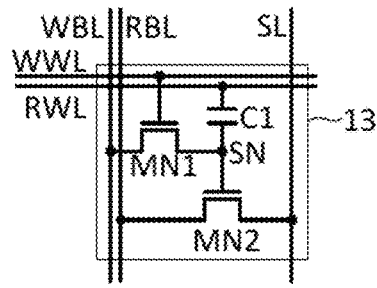

A memory cell 13 illustrated in FIG. 5C is another modification example of the memory cell 10 and includes a transistor MN2 instead of the transistor MP2. When the memory cell 13 is included in a memory cell array, the replica cell 22 or 23 can be included in a replica cell array.

Figure 5D:
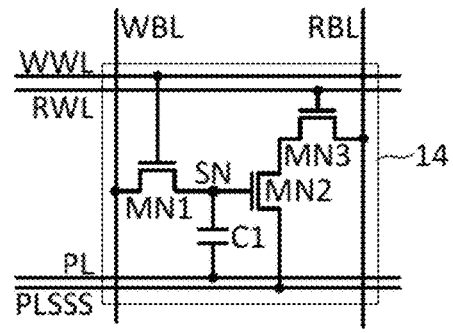

A memory cell 14 illustrated in FIG. 5D is another modification example of the memory cell 11 and includes the transistor MN2 and a transistor MN3 instead of the transistors MP2 and MP3. Instead of the wiring PLDDD, a wiring PLSSS is electrically connected to the memory cell 14. For example, the potential VSSS is input to the wirings PL and PLSSS from the outside.

When the memory cell 14 is included in a memory cell array, the replica cell 22 or 23 can be included in a replica cell array. In that case, the memory cell array cannot include the sourceline SL, and thus the replica cell 22 (or 23) is electrically connected to the wiring PLSSS instead of the sourceline SL.

In the memory cell 14, the transistor MN1 may be changed to the transistor MN5 having a back gate which is included in the memory cell 12. The transistors MN2 and MN3 may be OS transistors like the transistor MN1. In that case, the OS transistor may have a back gate. The same applies to the memory cell 13.

Figure 6A:
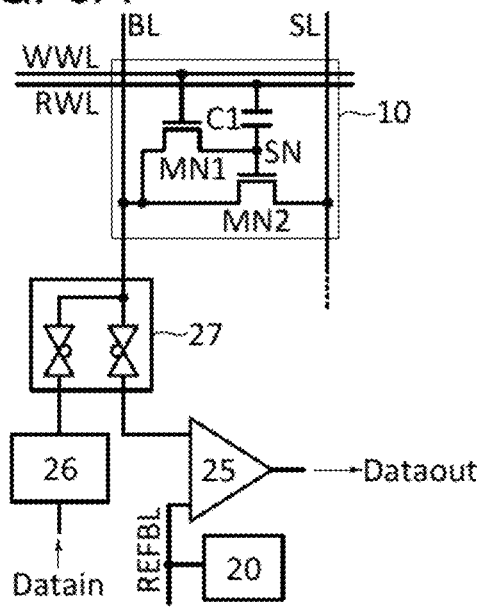
FIGS. 6A and 6B are circuit diagrams showing structure examples of a memory cell array and a column circuit.
Figure 6B:
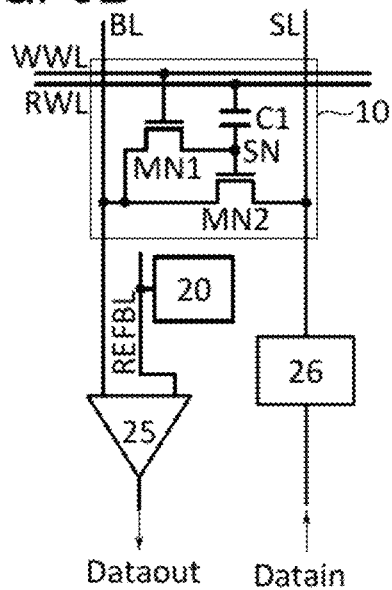

In the memory cell array 115, the write bitline WBL and the read bitline RBL can be a common bitline BL as shown in FIGS. 6A and 6B. Although FIGS. 6A and 6B are examples in which a memory cell array includes the memory cell 10, the memory cell 11, the memory cell 12, a memory cell 13, or a memory cell 14 may be used instead of the memory cell 10.

In the configuration example shown in FIG. 6A, the column circuit 113 includes a selection circuit 27. The selection circuit 27 has a function of selecting whether to connect the bitline BL to an input terminal of the read circuit 25 or to an output terminal of the write circuit 26. The write circuit 26 has a function of inputting data to the bitline BL. In the example shown in FIG. 6A, the selection circuit 27 includes two analog switches which are turned on and off in a complementary manner.

In the configuration example shown in FIG. 6B, the write circuit 26 is electrically connected to the sourceline SL. The write circuit 26 inputs data to the sourceline SL. In the writing operation, the transistors MN1 and MN2 are turned on. The data that has been input to the sourceline SL is written to the node SN by the transistors MN2 and MN1.

Figure 6C:
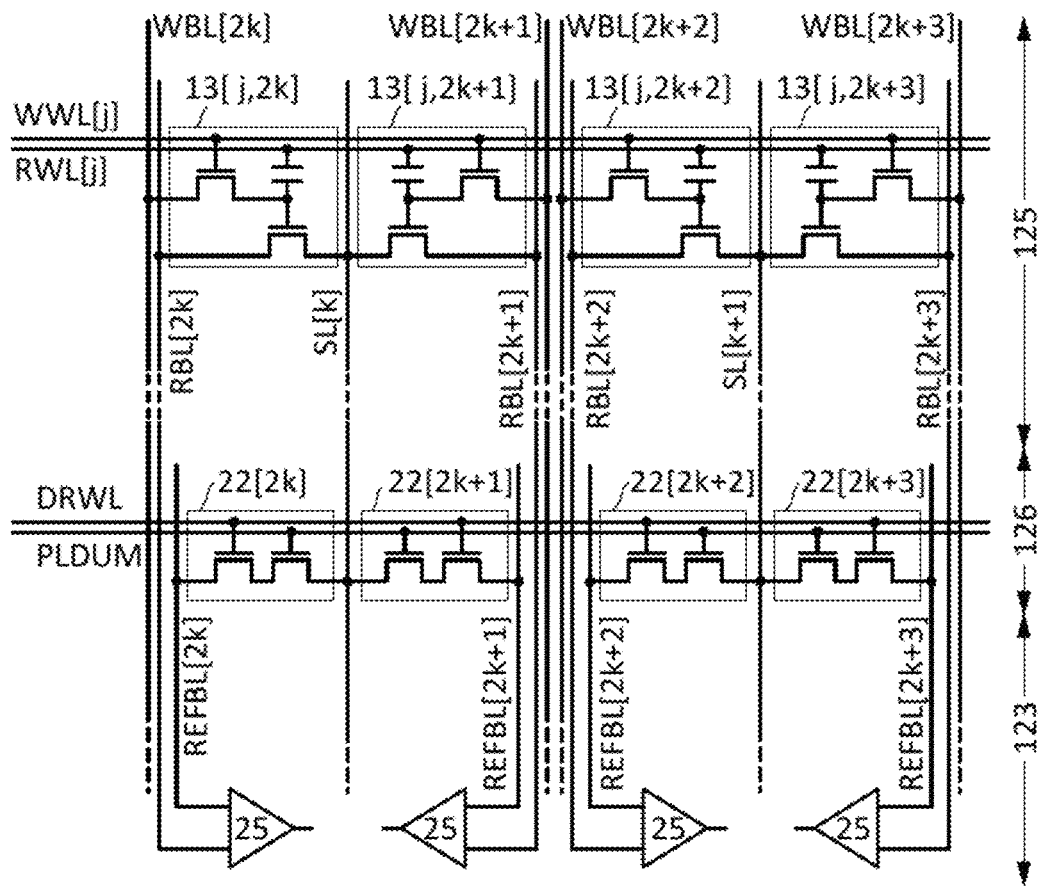
FIG. 6C is a circuit diagram showing a structure example of a memory cell array, a replica cell array, and a column circuit.

The sourceline SL can be shared by adjacent two columns (an odd-numbered and even-numbered columns) in a memory cell array and a replica cell array as shown in FIG. 6C. In a configuration example of FIG. 6C, j and k are integer of 0 or more. A memory cell array 125 includes the memory cell 13. A replica cell array 126 includes a replica cell 22. A column circuit 123 includes the read circuit 25 for each column.

In this embodiment, the replica cell in the NOSRAM generates a read judge potential, which can optimize the read judge potential and increase the resistance to PVT variations. As a result, the reading rate of the NOSRAM can be increased.

Needless to say, application of this embodiment is not limited to a NOSRAM. This embodiment can be applied to a gain cell DRAM in which a write transistor of a memory cell is an Si transistor. In the gain cell DRAM, the write transistor of the memory cell may be an n-channel transistor or a p-channel transistor.

Embodiment 2

More specific configuration example of the NOSRAM is described in this embodiment.

<<Configuration Example of NOSRAM>>

Figure 7A:
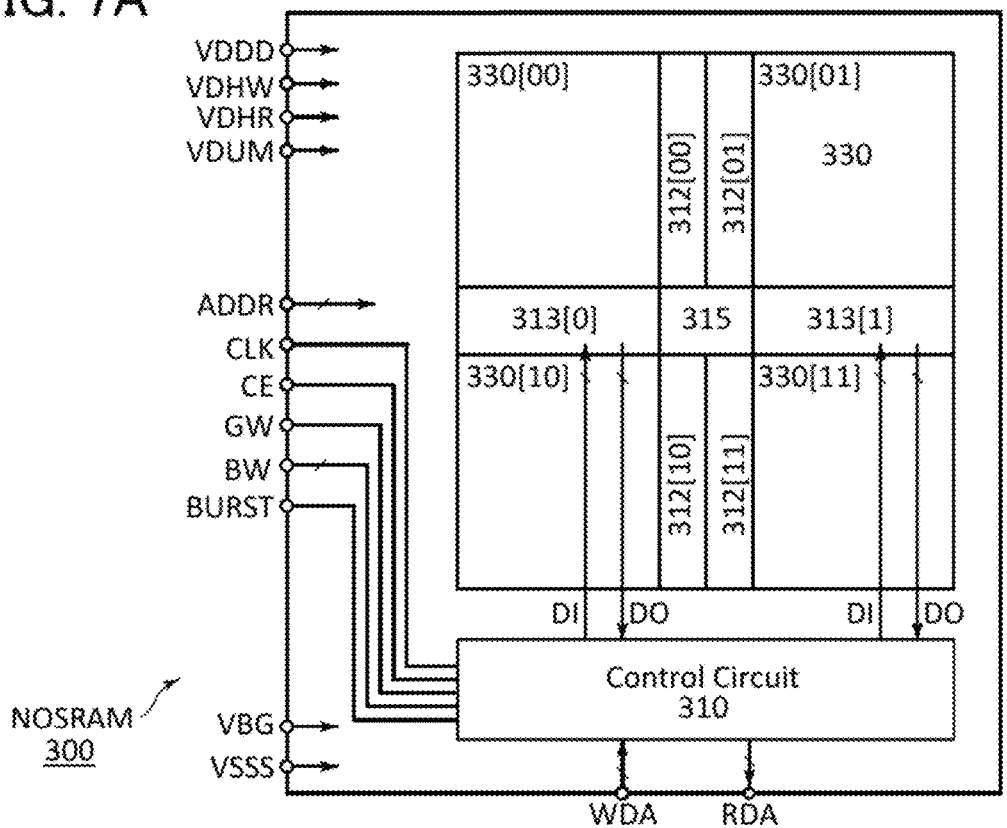
FIGS. 7A and 7B are block diagrams showing configuration examples of a NOSRAM.

FIG. 7A is a block diagram showing a configuration example of a NOSRAM. A NOSRAM 300 includes a memory cell array, a control circuit 310, row circuits 312[00] to 312[10], column circuits 313[0] and 313[1], and a predecoder 315. The memory cell array of the NOSRAM 300 is divided into four. Here, the four memory cell arrays are referred to as blocks 330[00] to 330[11].

A row circuit 312 [XX] is a row circuit of the block 330[XX] (X is 0 or 1). Two blocks 330 share one column circuit 313. A column circuit 313[0] is shared by the blocks 330[00] and 330[10]. A column circuit 313[1] is shared by the blocks 330[01] and 330[11].

Potentials VDDD, VSSS, VDHW, VDHR, VDUM, and VBG are input to the NOSRAM 300.

Signals CLK, CE, GW, BW, BURST, and ADDR are input to the NOSRAM 300. The signal CLK is a clock signal. The signal CE is a chip enable signal. The signal GW is a global write enable signal. The signal BW is a byte write enable signal. The signal BURST is a burst signal controlling burst operation. The signal ADDR is an address signal. Data WDA is write data input from the outside. Data RDA is read data output from the NOSRAM 300. Data DO is data read out from the memory cell array. Data DI is data written to the memory cell array.

The circuits, signals, and potentials in the NOSRAM 300 can be appropriately selected as needed. Another circuit or signal may be added. Structures (e.g., bit lengths) of input and output signals to/from the NOSRAM 300 are determined on the basis of the operation mode of the NOSRAM 300, the configuration of the memory cell array, and the like.

Figure 7B:
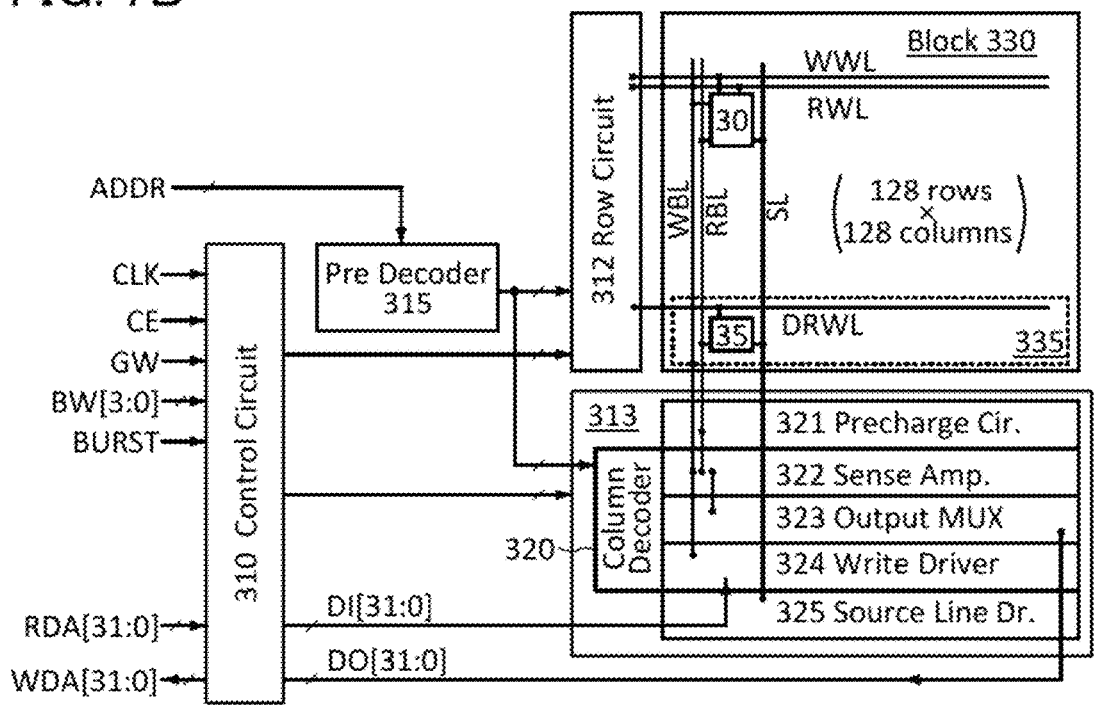

A more specific configuration example of the NOSRAM 300 is described below with reference to FIG. 7B. In the example of FIG. 7B, the block 330 is a memory cell array in 128 rows and 128 columns. The bit length of data is 32 bit (1 word).

(Control Circuit 310)

The control circuit 310 is a logic circuit having a function of controlling the entire operation of the NOSRAM 300. The control circuit 310 has a function of performing a logic operation of the signals CE, GW, BW[3:0], and BURST to determine an operation mode, and a function of generating control signals for the row circuit 312 and the column circuit 313 so that the determined operation mode is executed. Table 1 is a truth table of the control circuit 310.

TABLE 1

| Operation | CE | GW | BW[0] | BW[1] | BW[2] | BW[3] | BURST |
|---|---|---|---|---|---|---|---|
| Standby | L | X | X | X | X | X | X |
| Read | H | L | L | L | L | L | L |
| Byte-0 write | H | H | H | L | L | L | L |
| Half-word write | H | H | H | H | L | L | L |
| Word write | H | H | H | H | H | H | L |
| Burst read | H | L | L | L | L | L | H |
| Burst write | H | H | H | H | H | H | H |
| Refresh | H | H | L | L | L | L | L |

Note that the byte-0 write operation means an operation for writing data of 1 byte (8 bits) assigned to a signal BW[0]. For example, in the byte-0 write operation, data WDA[7:0] is written. In a byte write operation, when signals BW[1], BW[2], and BW[3] are "H", data WDA[15:8], WDA[23:16], and WDA[31:24] are written.

<Predecoder 315>

The predecoder 315 has a function of decoding the signal ADDR and determining the block 330 to be accessed.

<Row Circuit 312>

Figure 8:
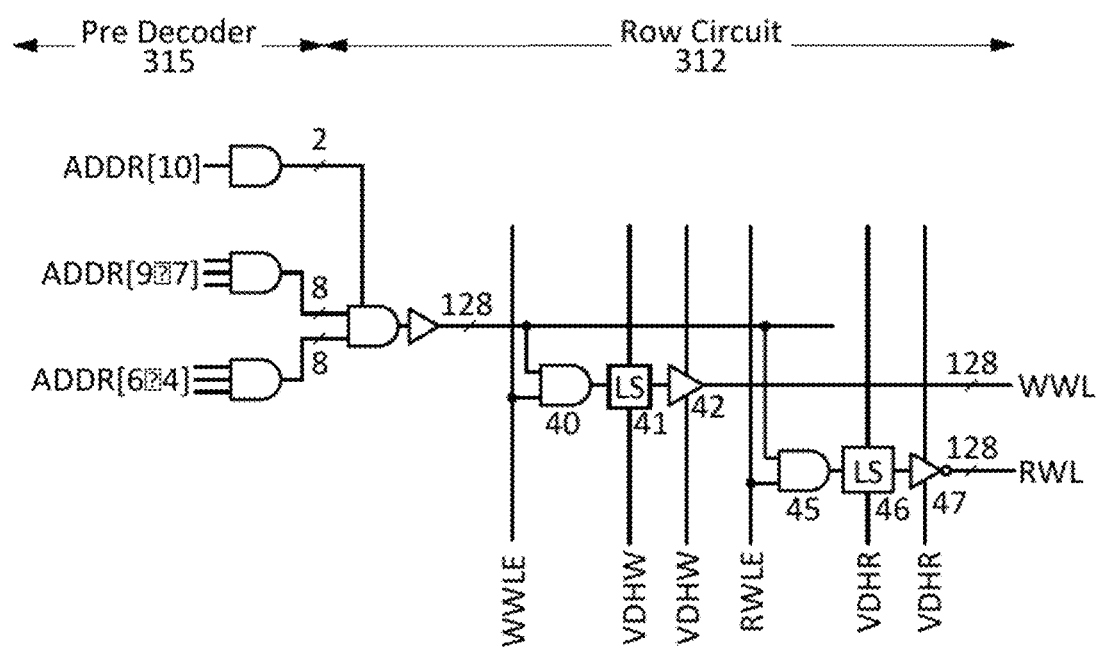
FIG. 8 is a circuit diagram illustrating a configuration example of a row circuit.

The row circuit 312 has a function of decoding a row address and driving the wordlines WWL, RWL, and DRWL. FIG. 8 shows a configuration example of the row circuit 312.

FIG. 8 shows circuit elements relating to generation of driving signals of the wordlines WWL and RWL of the predecoder 315. In the predecoder 315, the signal ADDR [10:4] is decoded by a logic circuit including an AND circuit, an OR circuit, a buffer circuit, and the like. Note that numerals (2, 8, 128) that are not reference numerals mean the number of wirings in FIG. 8.

In the row circuit 312, an AND circuit 40, a level shifter (LS) 41, and a buffer circuit 42 generate a selection signal of the wordline WWL, and an AND circuit 44, a level shifter 45, and an inverter circuit 46 generates a selection signal of the world line RWL. The potential VDHW is input as a high level power supply potential of the level shifter 41 and the buffer circuit 42. The potential VDHR is input as a high level power supply potential of the level shifter 45 and the inverter circuit 46.

Signals WWLE and RWLE are signals generated by the control circuit 310. The signal WWLE is a write wordline enable signal. The signal RWLE is a read wordline enable signal.

<Block 330>

Figure 9:
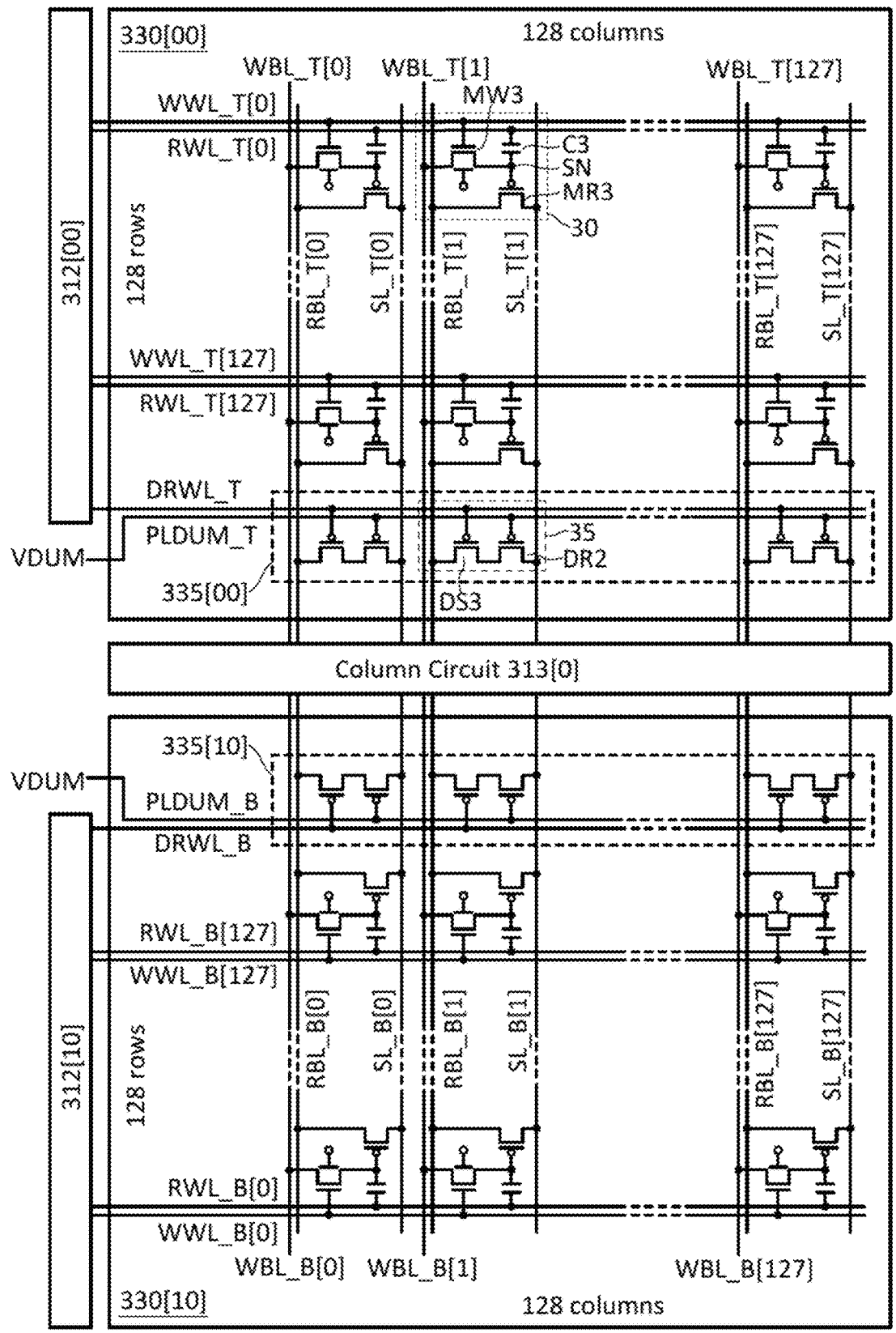
FIG. 9 is a circuit diagram illustrating a configuration example of a block.

The block 330 includes a memory cell 30, the wordlines WWL and RWL, the bitlines WBL and RBL, and the sourceline SL. The block 330 includes a replica cell array 335. The replica cell array 335 includes a replica cell 35 and the wordline DRWL. FIG. 9 shows a configuration example of the blocks 330[00] and 330[10].

Note that when circuit elements and the like are distinguished between the block 330[00] and the block 330[10], references "_T" and "_B" are used. For example, a bitline RBL_T is a bitline RBL of the block 330[00], and a bitline RBL_B is a bitline RBL of the block 330[10].

The memory cell 30 has the same circuit configuration as the memory cell 10 and includes transistors MW3 and MR3, a capacitor C3, and a node SN. A back gate of the transistor MW3 is electrically connected to a power supply line for supplying the potential VBG.

The replica cell array 335 includes the replica cell 35. The replica cell 35 is electrically connected to the wordline DRWL, the bitline RBL, the sourceline SL, and the wiring PLDUM. The replica cell 35 has the same circuit configuration as the replica cell 20 and includes transistors DR3 and DS3.

In this embodiment, a replica cell array 335[00] in the block 330[00] is used for a generation circuit of a read judge potential Vref_B for the block 330[10], and a replica cell array 335[10] is used for a generation circuit of a read judge potential Vref_T for the block 330[00]. Thus, the bitline RBL_B functions as a reference bitline REFBL_T when the block 330[00] performs the read operation, and the bitline RBL_T functions as a reference bitline REFBL_B when the block 330[10] performs the read operation.

The blocks 330[01] and 330[11] have the same structures as the blocks 330[00] and 330[10]. Like the memory cell array 125 and the replica cell array 126 shown in FIG. 6C, the sourceline SL can be shared between adjacent two columns in the block 330.

In this embodiment, a memory cell array is divided into a plurality of blocks, so that the bitline RBL functions as a reference bitline for a different block. With such a circuit configuration, area overhead caused when a replica cell array and a reference bitline are provided in a memory cell array can be prevented. Thus, the structure of the memory cell array in this embodiment is effective in increasing the capacity of a NOSRAM.

<Column Circuit 313>

The column circuit 313 has a function of writing data to the block 330, a function of reading data from the block 330, a function of amplifying data, a function of storing data temporarily, and the like. More specifically, the column circuit 313 has a function of controlling potentials of the bitlines WBL, RBL, and SL, for example. The column circuit 313 in the example shown in FIG. 7B includes a column decoder 320, a precharge circuit 321, a sense amplifier 322, an output MUX (multiplexer) 323, a writing driver 324, and a sourceline driver 325.

Figure 10:
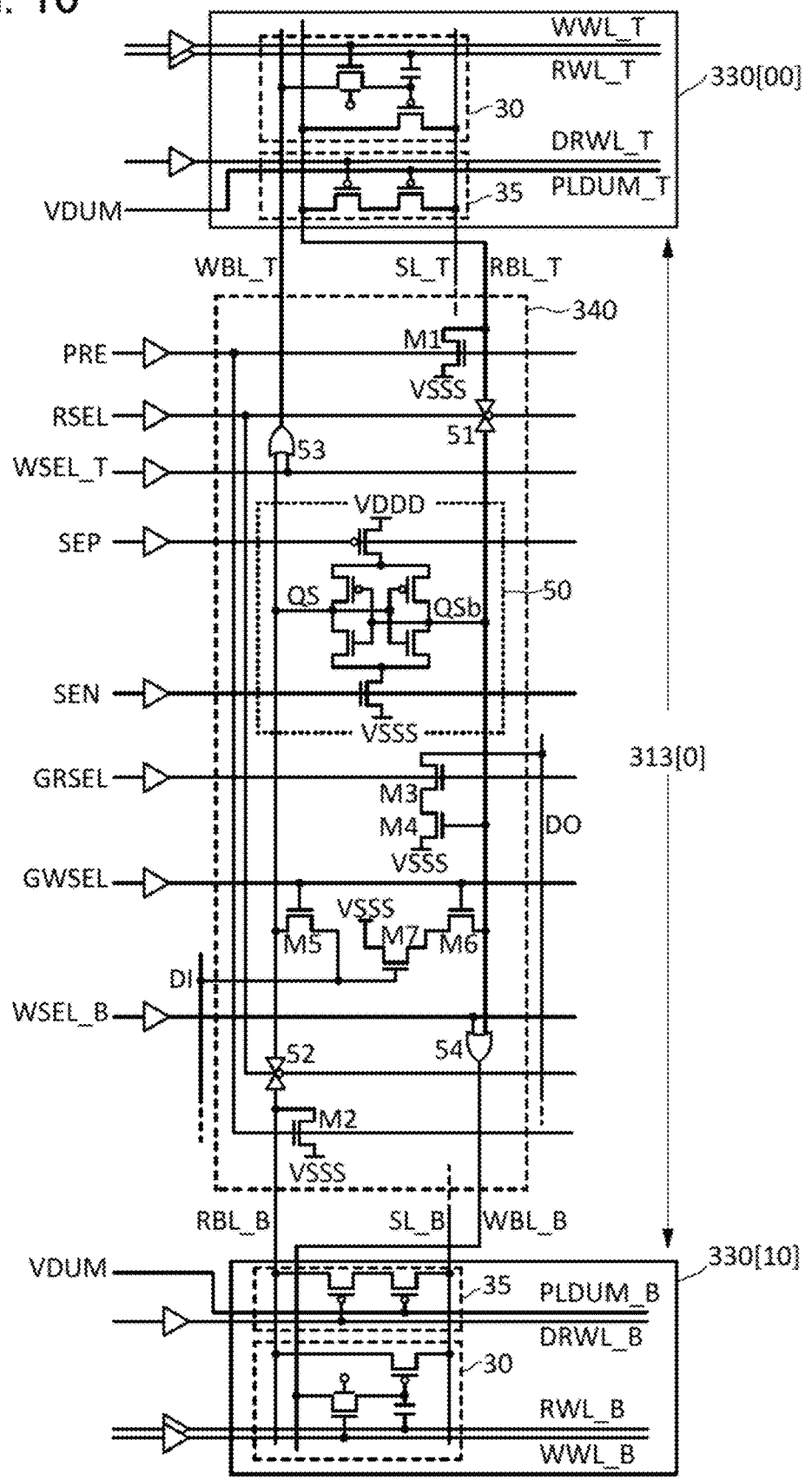
FIG. 10 is a circuit diagram illustrating a configuration example of a column circuit.

FIG. 10 shows an example of a circuit configuration of the column circuit 313[0]. The column circuit 313[0] has the same configuration as the column circuit 313[1].

In the column circuit 313[0], a circuit 340 is provided for each column. The circuit 340 includes a sense amplifier 50, transistors M1 and M2, analog switches 51 and 52, OR circuits 53 and 54, and transistors M3 to M7.

The column circuit 313 operates in response to signals SEN[3:0], SEP[3:0], PRE, RSEL[3:0], WSEL_T, WSEL_B, GRSEL[3:0], and GWSEL[15:0]. Note that 1-bit signal of any of the 4-bit signal SEN[3:0] is input to each circuit 340. The same applies to other signals such as the signal SEP[3:0].

(Precharge Circuit 321)

The transistors M1 and M2 are included in the precharge circuit 321. The bitline RBL_T is precharged to the potential VSSS by the transistor M1. The bitline RBL_B is precharged to the potential VSSS by the transistor M2. The precharge circuit 321 is controlled by the signal PRE.

(Sense Amplifier 322)

The sense amplifier 50 is included in the sense amplifier 322. The sense amplifier 50 here is a latch sense amplifier. Two connection portions, an input node and an output node for two inverter circuits in the sense amplifier 50, are nodes QS and QSb. The signals SEN and SEP are signals for activating the sense amplifier 50.

The column circuit 313 includes a circuit controlling the electrical continuity between the sense amplifier 50 and the bitlines RBL_T, WBL_T, RBL_B, and WBL_B. The analog switch 51 controls the electrical continuity between the node QSb and the bitline RBL_T. The analog switch 52 controls the electrical continuity between the sense amplifier 50 and the bitline RBL_B. The signal RSEL controlling the analog switches 51 and 52 is a read selection signal. The OR circuit 53 controls the electrical continuity between the sense amplifier 50 and the bitline WBL_T. The OR circuit 54 controls the electrical continuity between the sense amplifier 50 and the bitline WBL_B. The signals WSEL_T and WSEL_B controlling the OR circuits 53 and 54 are write selection signals.

Although FIG. 10 shows the example in which the bitlines WBL_T and RBL_B are electrically connected to the node QS of the sense amplifier 50 and the bitlines WBL_B and RBL_T are electrically connected to the node QSb, the bitlines WBL_B and RBL_T may be electrically connected to the node QS and the bitlines WBL_T and RBL_B may be electrically connected to the node QSb.

The sense amplifier 50 serves as a read circuit in the read operation. When data is read from the block 330[00], the sense amplifier 50 judges whether the potential of the node QSb is data "0" or "1" using the potential of the node QS at the time of the activation as the potential Vref. When data is read from the block 330[10], the sense amplifier 50 judges whether the potential of the node QS is data "0" or "1" using the potential of the node QSb at the time of the activation as the potential Vref.

The sense amplifier 50 serves as a latch circuit in the write operation and stores data temporarily.

<Output MUX 323>

The transistors M3 and M4 are included in the output MUX 323. The output MUX 323 is a multiplexer of 128 input and 32 output. The signal GRSEL[3:0] is a global read selection signal and controls the output MUX 323.

The circuits 340 in every four column are electrically connected to a shared wiring for data DOW (j is an integer of 0 to 31). For example, the circuits 340[0] to 340[3] are electrically connected to a wiring to which data DO[0] is written.

<Write Driver 324>

The transistors M5 to M7 are included in the write driver 324. The write driver 324 writes data in byte units, half-word units, or word units in response to the signal GWSEL[15:0]. The signal GWSEL[15:0] is a global write selection signal.

The circuits 340 in every four column are electrically connected to a shared wiring for data DI[j] (j is an integer of 0 to 31). For example, the circuits 340[0] to 340[3] are electrically connected to a wiring from which data DI[0] is output.

<<Operation Example of NOSRAM>>

An operation example of the NOSRAM 300 is described with reference to timing charts shown in FIG. 11 and FIG. 12.

<Read Operation>

Figure 11:
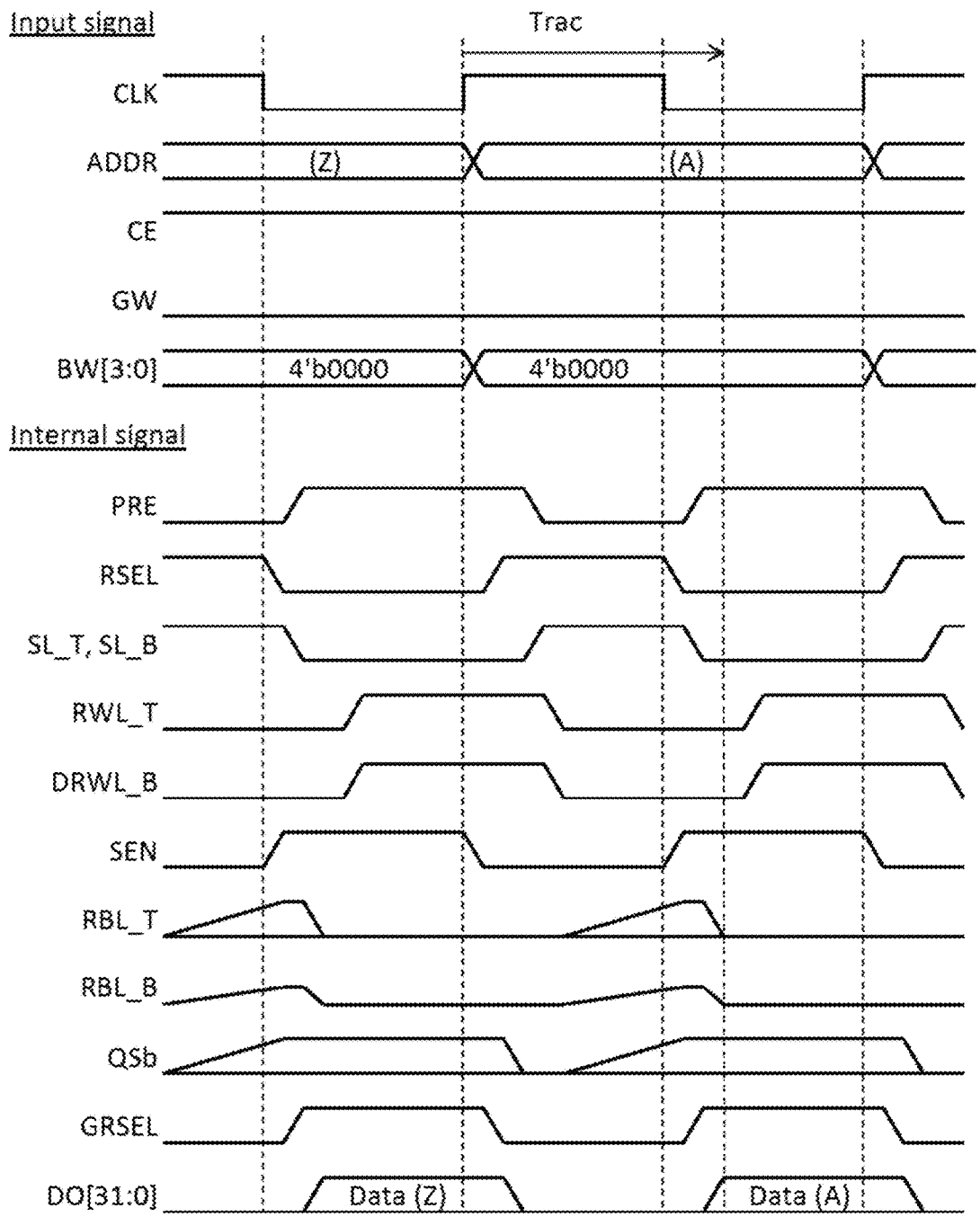
FIG. 11 is a timing chart showing an example of a read operation of a NOSRAM.

FIG. 11 is a timing chart of a read operation in which the block 330[00] is accessed. Addresses (Z) and (A) are input for different clock cycles, and data (Z) and (A) are read from the memory cells 30 specified by the addresses (Z) and (A), respectively. Trac is read access time.

The read operation in the NOSRAM 300 is similar to the read operation in the NOSRAM 100 shown in FIGS. 3A and 3B. The read operation is described focusing on the address (A).

The NOSRAM 300 performs the read operation while the signals CE, GW, and BW[3:0] are "1", "0", and 4'b0000, respectively (Table 1).

While the signal RPE is "H", the bitlines RBL_T and RBL_B are precharged to the potential VSSS. Then, the signal RSEL is set to "H" to electrically connect the bitline RBL_T and the node QSb and the bitline RBL_B and the node QS. As a result, the nodes QS and QSb are also precharged to the potential VSSS. The signal PRE is set to "L" to stop the precharge of the bitlines RBL_T and RBL_B. At the same time as the precharge stop, the sourcelines SL_T and SL_B are charged to the potential VDDD.

Next, the wordlines RWL_T and DRWL_B are set to "L". Whether the bitline RBL_T is charged or holds the precharge potential VSSS depends on the potential of the node SN of the memory cell 30. The bitline RBL_B is charged by the replica cell 35.

The signal RSEL is set to "L" to electrically disconnect the bitline RBL_T and the node QSb and the bitline RBL_B and the node QS. At the same time as the signal RSEL is set to "L", the signals SEN and SEP are set to "H" and "L", respectively, and the sense amplifier 50 is activated to reach the nodes QS and QSb full swing. At the activation of the sense amplifier 50, when the potential of the node QS is larger than the potential of the node QSb, the potential of the node QSb is VSSS. When the potential of the node QS is smaller than the potential of the node QSb, the potential of the node QSb is VDDD.

When the signal GRSEL is set to "H", the data (A) is output from the column circuit 313[0] to the control circuit 310.

The wordlines RWL_T and DRWL_B are set to "H". Then, the signals SEN and SEP are set to "L" and "H", respectively, to inactivate the sense amplifier 50. The signal GRSEL is set to "L" to finish the read operation.

<Write Operation>

Figure 12:
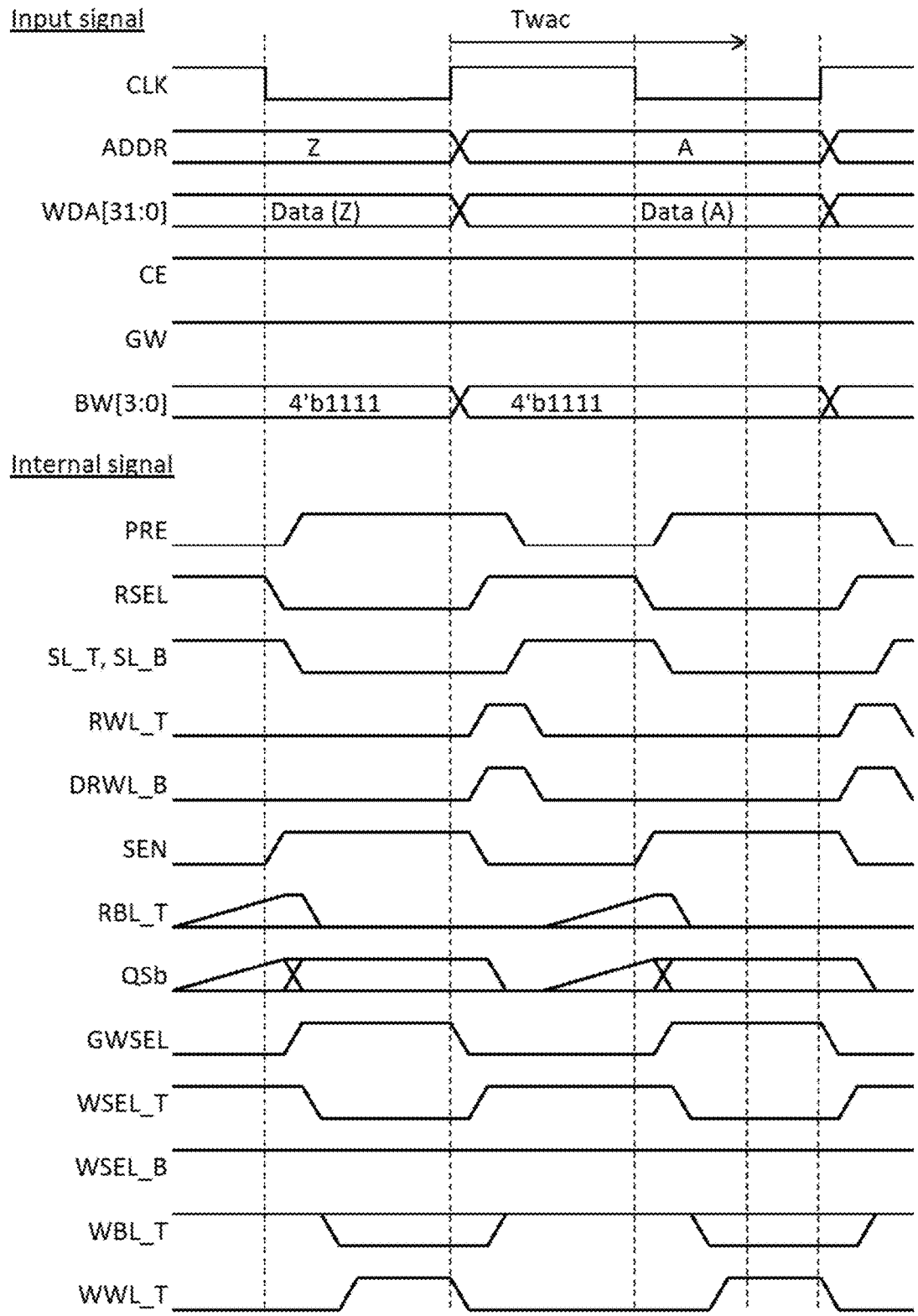
FIG. 12 is a timing chart showing an example of a write operation of a NOSRAM.

FIG. 12 is a timing chart of the write operation in which the block 330[00] is accessed. Different addresses (Z) and (A) and data (Z) and (A) are input for clock cycles, and the data (Z) and (A) are written to the memory cells 30 specified by the addresses (Z) and (A), respectively. Twac is write access time. Here, the write operation is described focusing on the address (A).

Since the signals CE, GW, and BW[3:0] are "1", "1", and 4'1111, respectively, the NOSRAM 300 performs the write operation.

The NOSRAM 300 supports a partial write operation (write-back method). While the signals WSEL_T and WSEL_B are "H", first, data is read from the memory cell 30 in a write-target row to the sense amplifier 50. The read operation is similar to the read operation shown in FIG. 11. The node QSb is charged or holds the precharge potential VSSS depending on data of the memory cell 30. The node QS is charged by the replica cell 35.

Next, the signals SEN and SEP are set to "H" and "L", respectively, so that the sense amplifier 50 is activated. Then, the signal GWSEL is set to "H" to write the data "DI" to the node QS. Data of the sense amplifier 50 in a column selected by the signal GWSEL is updated by the data DI. Data of the sense amplifier 50 in a non-selected column is not updated.

Next, the signal WSEL_T is set to "L" to electrically connect the bitline WBL_T and the node QS, so that the data of the node QS is input to the bitline WBL_T. Next, the wordline WWL_T is set to "H" to write data of the bitline WBL_T to the memory cell 30. The data of the memory cell 30 in the selected column is updated by the data DI, and stored data is written back to the memory cell 30 in the non-selected column.

The signal GWSEL and the wordline WWL_T are set to "L". Then, the signal SEN is set to "L" and the signals SEP and WSEL_T are set to "H" to finish the write operation.

<Simulation Results>

Figure 13:
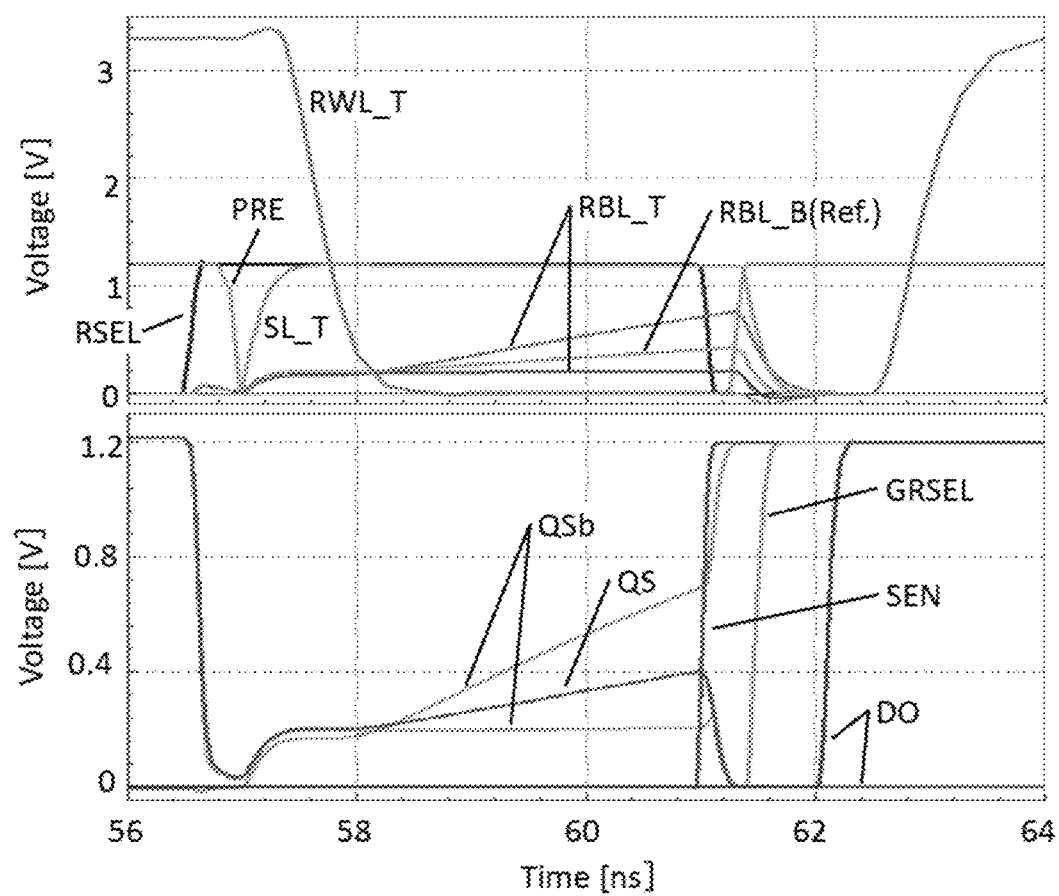
FIG. 13 is a simulation waveform chart of a NOSRAM in a read operation.
Figure 14:
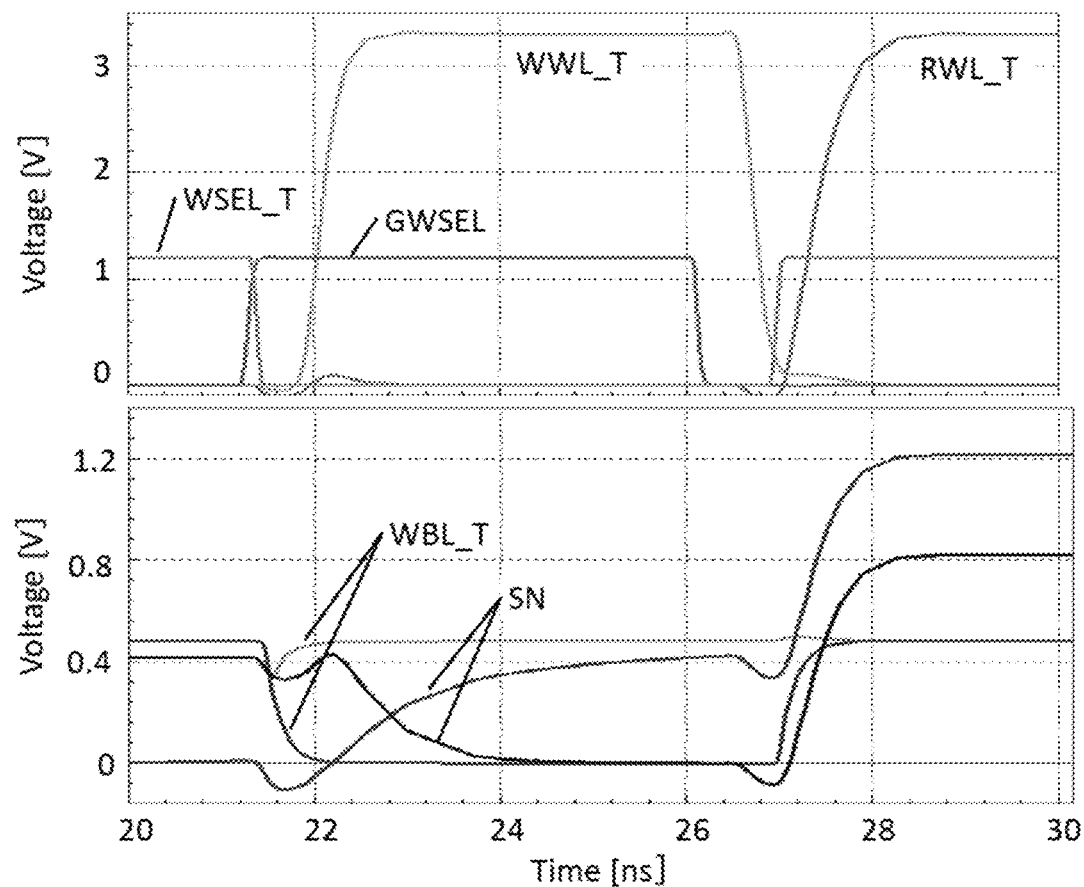
FIG. 14 is a simulation waveform chart of a NOSRAM in a write operation.

FIG. 13 to FIG. 15 show simulation results of the operation of the NOSRAM 300.

In this simulation, the potentials VDDD and VSSS are 1.2 V and 0 V, respectively, the potentials VDHW and VDHR are 3.3 V, and the potential VDUM is 0.12 V (=VDDDx0.1). The read transistor MP2 of the memory cell 30 and the read transistor DR2 of the replica cell 35 have the same specifications.

FIG. 13 shows signal waveforms in the read operation of the NOSRAM 300. FIG. 14 shows signal waveforms in the write operation. The read operation and write operation are performed in accordance with the timing chart of FIG. 3A.

FIG. 13 shows that the replica cell 35 can change the potential of the reference bitline RBL_B to have a value intermediate between the potential of the bitline RBL_T at the time when data "0" is read and the potential of the bitline RBL_T at the time when data "1" is read. In addition, FIG. 13 shows that the sense amplifier 50 can perform 0/1 judgment of data of the bitline RBL_T using the potential of the node QSb as a read judge potential, when the signal SEN becomes "H".

The operation frequencies of the NOSRAM in this embodiment and a NOSRAM in the comparison example were evaluated by simulation. FIG. 15 shows evaluation results. The structure of the NOSRAM in the comparison example is the same as that of the NOSRAM in this embodiment except that a fixed potential (=0.4 V) is input from the outside to the sense amplifier as a read judge potential.

In this NOSRAM, the maximum operation frequency of PVT corner in the worst case is higher than that of the comparison example. In this NOSRAM, data read operation from memory cells to sense amplifiers is performed together with read operation and write operation. Thus, time from when the read wordline is selected to when sense amplifiers are activated (Tact, see FIG. 3B) limits an improvement in operation frequency.

In the NOSRAM, the read judge potential can be optimized in accordance with transistor characteristics and environmental temperature, which leads to a shorter Tact. This is shown by the simulation results in FIG. 15.

<Increase in Capacity of NOSRAM>

An increase in capacity of the NOSRAM is described with reference to FIGS. 16A to 16C. The NOSRAM can perform a partial write operation without a wordline division circuit. Since the wordline division circuit is not used, there is no increase in chip area and power consumption; thus, the circuit configuration of the NOSRAM is very effective in increasing the capacity.

Figure 16A:
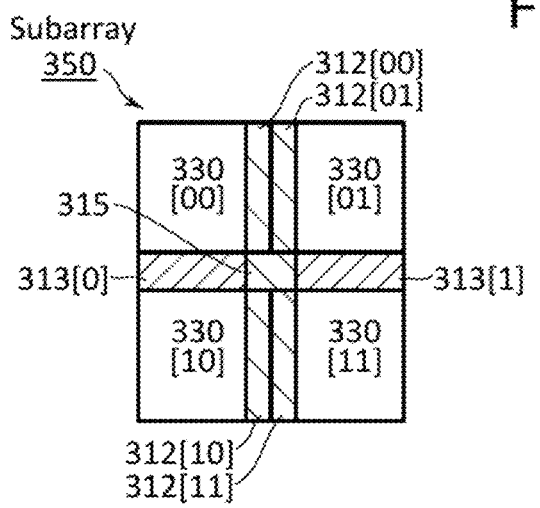
FIG. 16A is a block diagram showing a configuration example of a subarray of a NOSRAM.

For example, the capacity of the NOSRAM can be increased by unit of a subarray 350 shown in FIG. 16A. The subarray 350 includes four blocks, four row circuits 312, two column circuits 313, and a predecoder 315.

Figure 16B:
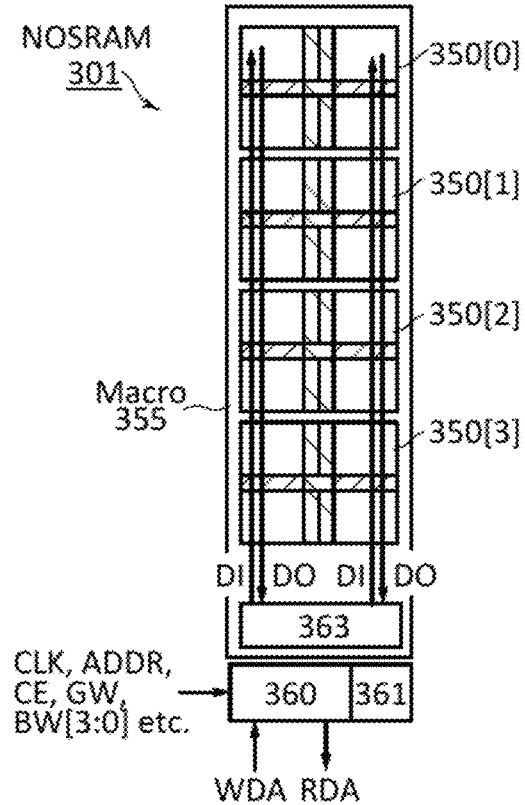
FIGS. 16B and 16C are block diagrams showing configuration examples of a NOSRAM.

A NOSRAM 301 shown in FIG. 16B includes subarrays 350[0] to 350[3], a control circuit 360, a predecoder 361, and a logic circuit 363. Like the control circuit 310, the control circuit 360 controls the NOSRAM 301 as a whole. The predecoder 361 has a function of decoding the signal ADDR and determining which subarray 350 to activate. The logic circuit 363 has a function of controlling input of the data DI and outputting the data DO to/from the subarrays 350[0] to 350[3].

Figure 16C:
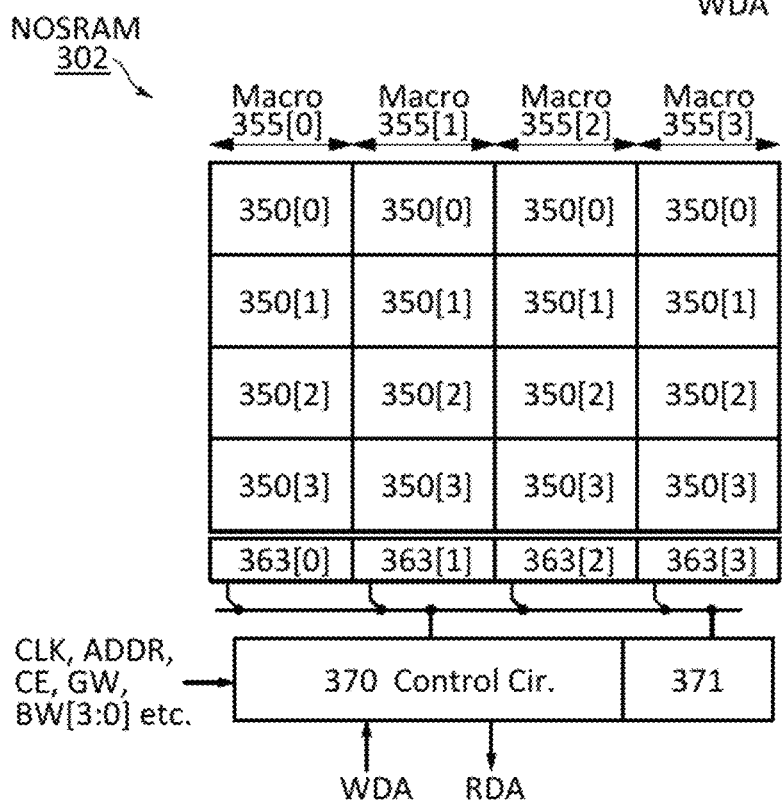

The capacity of the NOSRAM can be increased by unit of a function block (referred to as a macro 355) including the subarrays 350[0] to 350[3] and the logic circuit 363 as shown in an example in FIG. 16C.

The NOSRAM 302 shown in FIG. 16C includes four macro 355[0] to 355[3], a control circuit 370, and a predecoder 371. Like the control circuit 310, the control circuit 370 controls the NOSRAM 302 as a whole. The predecoder 371 has a function of decoding the signal ADDR and determining which macro 355 to activate.

Since the capacity of the subarray 350 is 8 kB (128 rows×128 columns×4 blocks), the capacities of the NOS-RAMs 301 and 302 are 32 kB and 128 kB, respectively.

Embodiment 3

The above-described NOSRAMs can be used for a memory device of a variety of electronic components and electronic devices. Since the above-described NOSRAMs can hold data for a long time, they can be incorporated as a non-volatile memory device into a variety of electronic components and electronic devices.

The above-described NOSRAMs can have performance comparable to that of an SRAM, a DRAM, or a flash memory. For example, the above-described NOSRAMs can be incorporated into various kinds of processors, such as a microcontroller unit (MCU), an FPGA, a CPU, a GPU, and an application processor (AP). The NOSRAMs can be incorporated into various kinds of ICs, such as a wireless IC, a display controller IC, a source driver IC, and a video decoder IC. The MCU is described here as an example of the processor.

<<MCU 400>>

Figure 17:
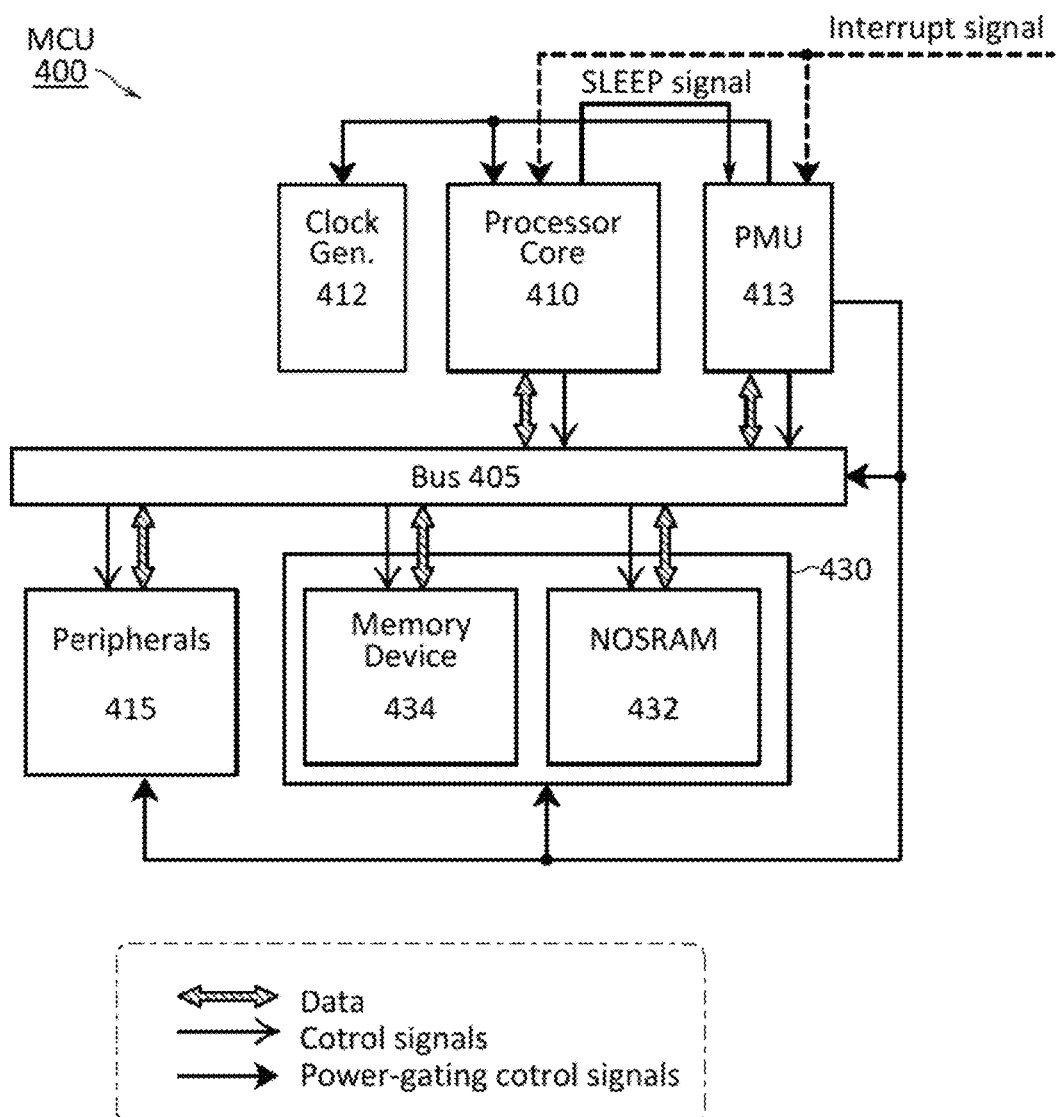
FIG. 17 is a block diagram illustrating a configuration example of a microcontroller unit.

FIG. 17 illustrates a configuration example of a microcontroller unit (MCU). An MCU 400 illustrated in FIG. 17 includes a bus 405, a processor core 410 (hereinafter referred to as a core 410), a clock generation circuit 412, a power management unit (PMU) 413, a peripheral circuit (Peripherals) 415, and a memory portion 430. The MCU 400 is a semiconductor device which is integrated into one chip.

The core 410 exchanges data with the PMU 413, the peripheral circuit 415, and the memory portion 430 through the bus 405. A control signal from the core 410 is input to the bus 405. The bus 405 sends the control signal to a circuit block which is to be controlled. The control signal include an enable signal and an address signal.

The clock generation circuit 412 generates a clock signal used in the MCU 400.

There is no particular limitation of the function of the peripheral circuit 415. In the peripheral circuit 415, various functional circuits are provided in accordance with the use of the MCU 400. Examples of the functional circuits include a power supply circuit, a power supply management unit, a timer device, an interrupt controller, an input/output port, an analog-digital converter (ADC), a comparator, and an operational amplifier.

The memory portion 430 includes an NOSRAM 432 and a memory device 434. The memory portion 430 may include hierarchized NOSRAMs 432. For example, as for a high-level NOSRAM, the capacity of a memory cell is reduced and accordingly the retention time is reduced but the write time can be shortened. As for a low-level NOSRAM, the capacity of a memory cell is increased, the retention time is increased, and the capacity is increased.

The memory device 434 can be any memory device as long as it can be rewritten; examples of such a memory device include a DRAM, an SRAM, a flash memory, a ferroelectric RAM (FeRAM), a magnetoresistive RAM (MRAM), a resistive RAM (ReRAM), and a phase-change RAM (PRAM).

The memory device 434 is not necessarily provided in the memory portion 430. Alternatively, the memory portion 434 may include a plurality of memory devices 434, such as an SRAM and flash memory. A read-only memory (ROM) may be provided in the memory portion 430.

The PMU 413 has a function of controlling power gating. The PMU 413 generates a power gating control signal on the basis of a sleep signal (SLEEP) transmitted from the core 410, an interrupt signal input from the outside, and the like. The generated power gating control signal is transmitted to circuits in the MCU 400, for example, the bus 405 and the core 410. Each circuit executes power gating sequence in response to the power gating control signal. The cache memory 332 executes the power gating sequence. The NOSRAM 432 can perform a power-off operation without a backup operation because it is a nonvolatile RAM.

<Example of Method for Manufacturing Electronic Component>

Figure 18A:
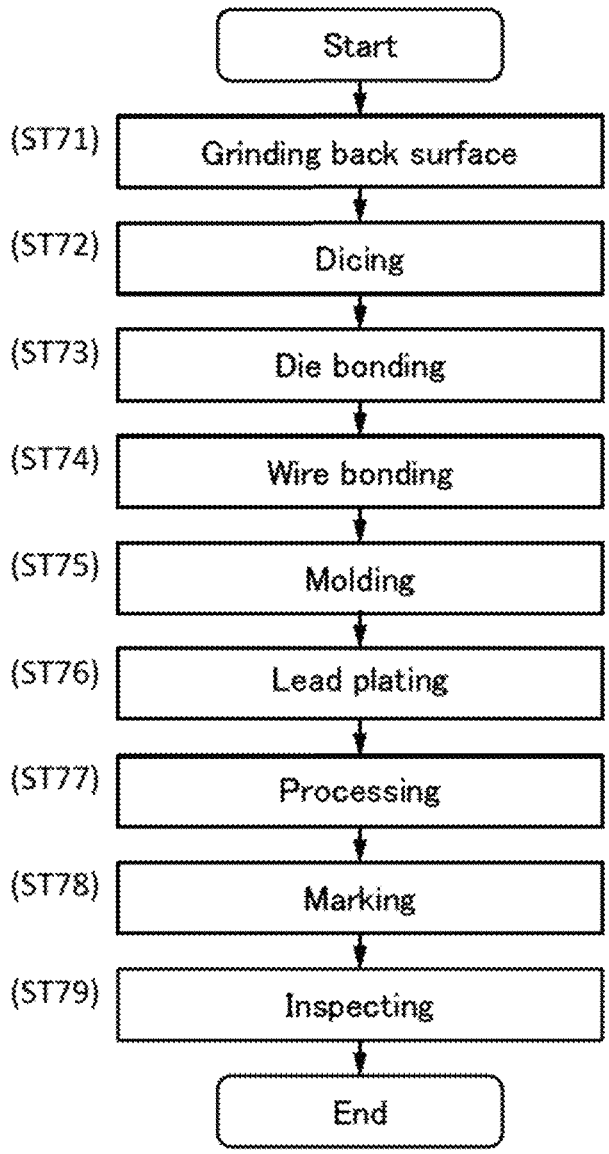
FIG. 18A is a flowchart showing a manufacturing method of an electronic component.

FIG. 18A is a flow chart showing an example of a method for manufacturing an electronic component. The electronic component is also referred to as a semiconductor package or an IC package.

A semiconductor device including a transistor is completed by integrating detachable components on a printed circuit board through an assembly process (post-process). The post-process can be finished through steps in FIG. 18A. In a pre-process, first, a semiconductor device in one embodiment of the present invention and the like are provided on a semiconductor wafer (e.g., a silicon wafer).

In the post-process, first, a rear-surface grinding step in which a rear surface of the semiconductor wafer (a surface on which a semiconductor device and the like are not formed) is ground is performed (Step ST71). This step aims to reduce the size of the electronic component by thinning the semiconductor wafer through grinding. After Step ST71, a dicing step of separating the semiconductor wafer into a plurality of chips is performed (Step ST72). In the dicing step, the semiconductor wafer is cut along dicing lines, so that chips are cut out from the semiconductor wafer.

A die bonding step in which the separated chips are separately picked out and bonded on a lead frame is performed (Step ST73). In the die bonding step, the chip may be bonded to the lead frame by an appropriate method depending on a product, for example, with resin or tape. The chip may be bonded to an interposer substrate instead of the lead frame.

Next, a wire bonding step of electrically connecting a lead of the lead frame and an electrode on the chip with a metal fine line (wire) is performed (Step ST74). A silver line, a gold line, or the like can be used as the metal fine line. For wire bonding, ball bonding or wedge bonding can be employed, for example. A wire-bonded chip 7110 is subjected to a molding step of sealing the chip with epoxy resin or the like (Step ST75).

The lead of the lead frame is plated in a lead plating step (Step ST76). Then, the lead is cut and processed into a predetermined shape in a formation step (Step ST77). A printing (marking) step is performed on a surface of the package (Step ST78). After an inspection step (Step ST79) for checking whether an external shape is acceptable and whether there is a malfunction, for example, the electronic component is completed.

Figure 18B:
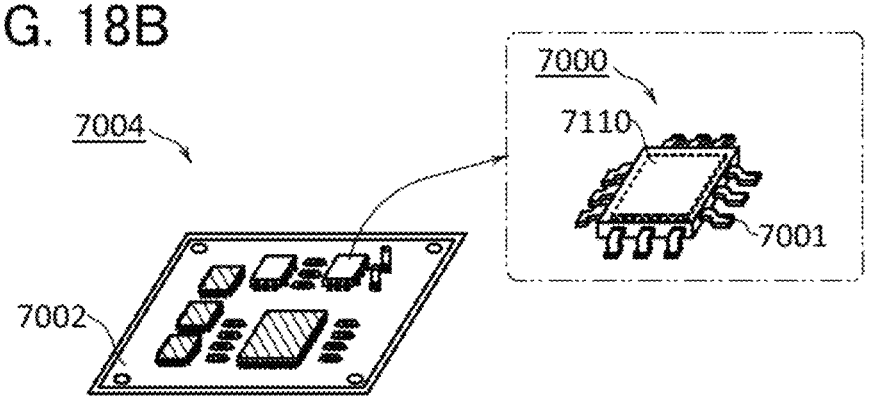
FIG. 18B is a schematic view showing a structure example of the electronic component.

FIG. 18B is a schematic perspective view of the completed electronic component. The electronic component has a plurality of standards and names depending on a terminal extraction direction and a terminal shape. FIG. 18B illustrates a quad flat package (QFP) as an example of the electronic component.

An electronic component 7000 in FIG. 18B includes a lead 7001 and the chip 7110. The chip 7110 includes any of the storage devices in this embodiment or a processor including the storage device.

The electronic component 7000 may include a plurality of chips 7110. The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 includes a low-power semiconductor device; thus, implementation of the electronic component 7000 in an electronic device can reduce the power consumption of the electronic device. Next, an electronic device including the electronic component is described.

Figure 19A:
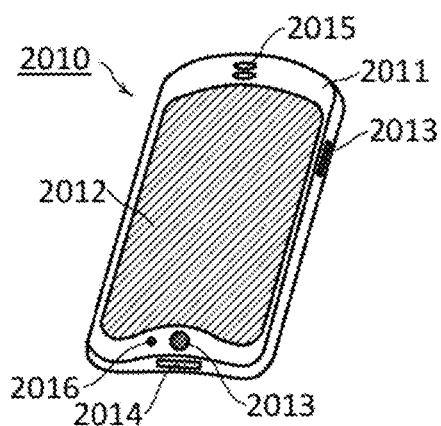
FIGS. 19A to 19F illustrate structure examples of electronic devices.

An information terminal 2010 in FIG. 19A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Various operations such as power on/off operation and screen switching of the display portion 2012 can be performed by pressing the operation button 2013.

Figure 19B:
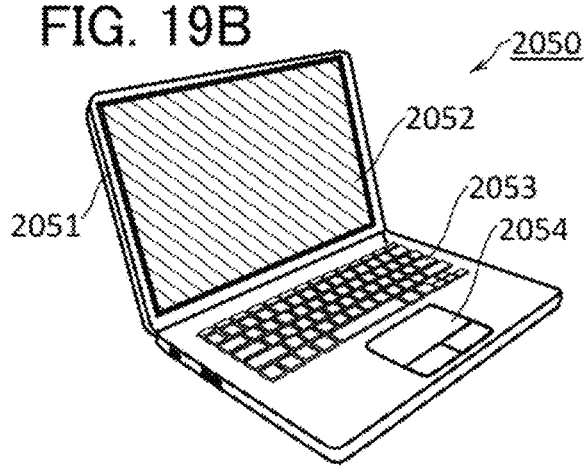

A laptop 2050 in FIG. 19B includes a housing 2051, a display portion 2052, a keyboard 2053, and a pointing device 2054. The laptop 2050 can be operated by touch operation of the display portion 2052.

Figure 19C:
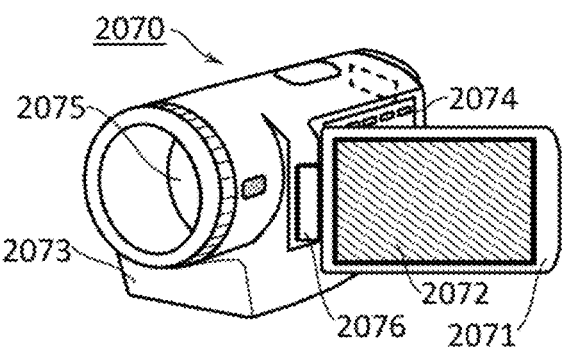

A video camera 2070 in FIG. 19C includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 19D:
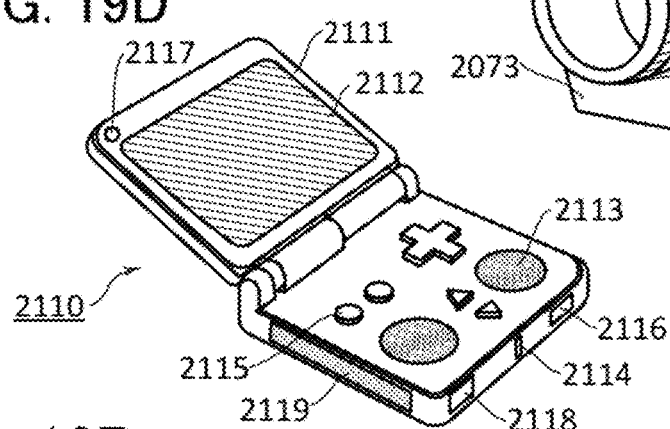

A portable game machine 2110 in FIG. 19D includes a housing 2111, a display portion 2112, speakers 2113, an LED lamp 2114, operation key buttons 2115, a connection terminal 2116, a camera 2117, a microphone 2118, and a recording medium read portion 2119.

Figure 19E:
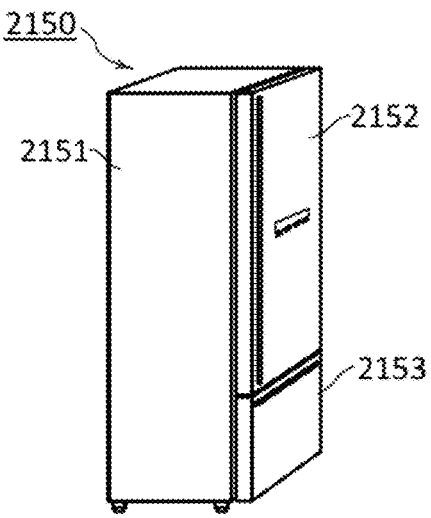

An electric refrigerator-freezer 2150 in FIG. 19E includes a housing 2151, a refrigerator door 2152, a freezer door 2153, and the like.

Figure 19F:
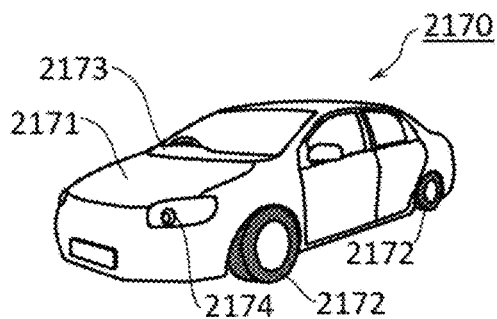

A motor vehicle 2170 in FIG. 19F includes a car body 2171, wheels 2172, a dashboard 2173, lights 2174, and the like.

Embodiment 4

In this embodiment, a semiconductor device including an Si transistor and an OS transistor is described. The structure of such a semiconductor device is described here using the NOSRAM 300 in Embodiment 2.

<<Stacked-layer structure of NOSRAM>>

Figure 20:
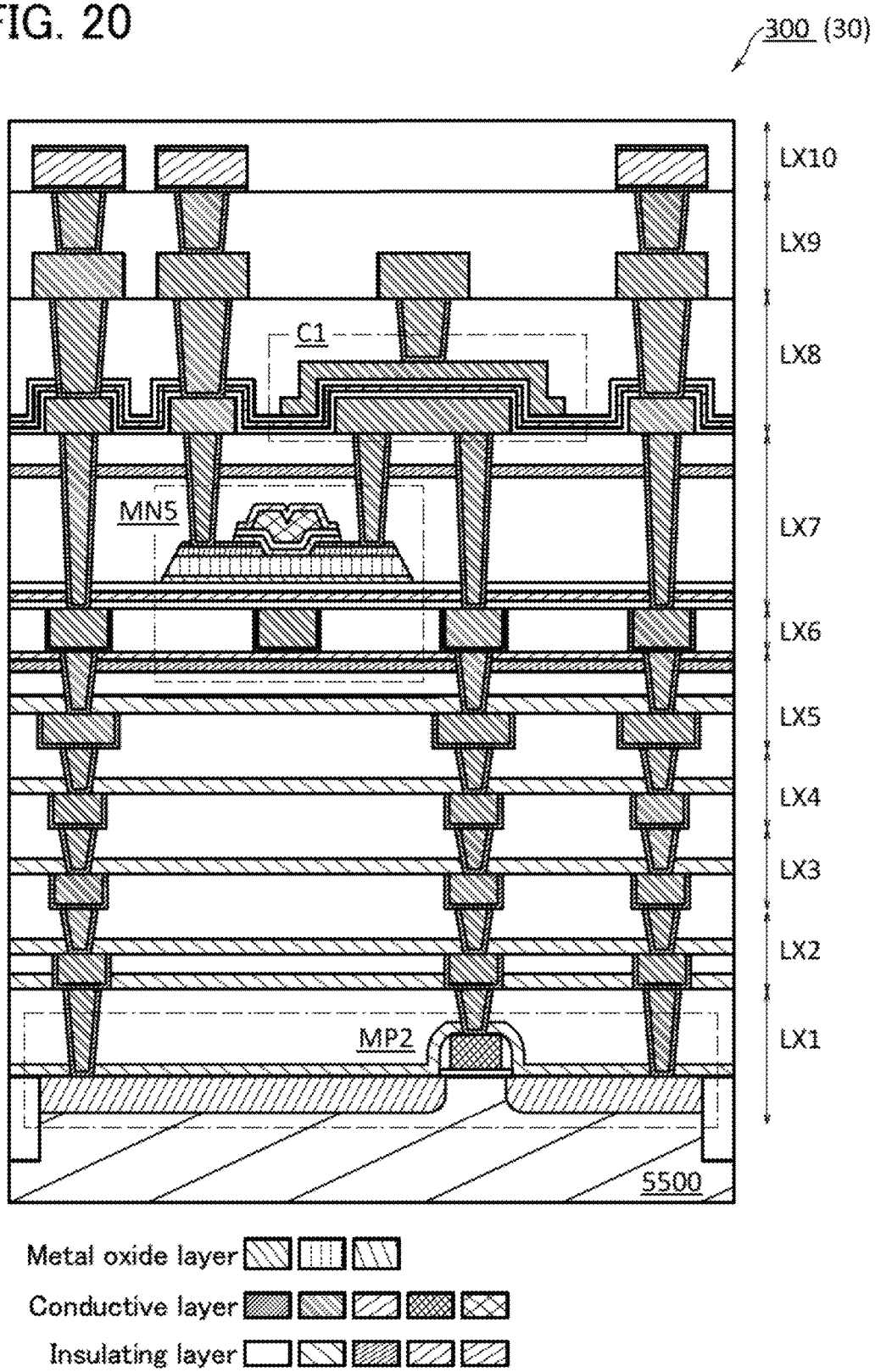
FIG. 20 is a cross-sectional view showing a stacked-layer structure of a NOSRAM.

The structure of the NOSRAM 300 is described with reference to FIG. 20. FIG. 20 shows a cross section of the memory cell 30 as an example. The NOSRAM 300 includes a single crystal silicon wafer 5500 and a stacked-layer including layers LX1 to LX10. The layers LX1 to LX10 include transistors, wirings, electrodes, plugs, and the like.

In the layer LX1, an Si transistor included in the NOSRAM 300, such as the transistor MP2, is provided. A channel formation region of the Si transistor is provided in the single crystal silicon wafer 5500.

The layer LX7 includes an OS transistor such as the transistor MN5. Note that a back gate electrode of the OS transistor is provided in the layer LX6. The OS transistor here has a structure similar to a below-described OS transistor 5001 (see FIG. 22A).

The layer LX8 includes a capacitor C1. The capacitor C1 can be provided below the layer LX7 as shown in an example of FIG. 21. The capacitor C1 is provided in the layer LX4 in FIG. 21.

Figure 21:
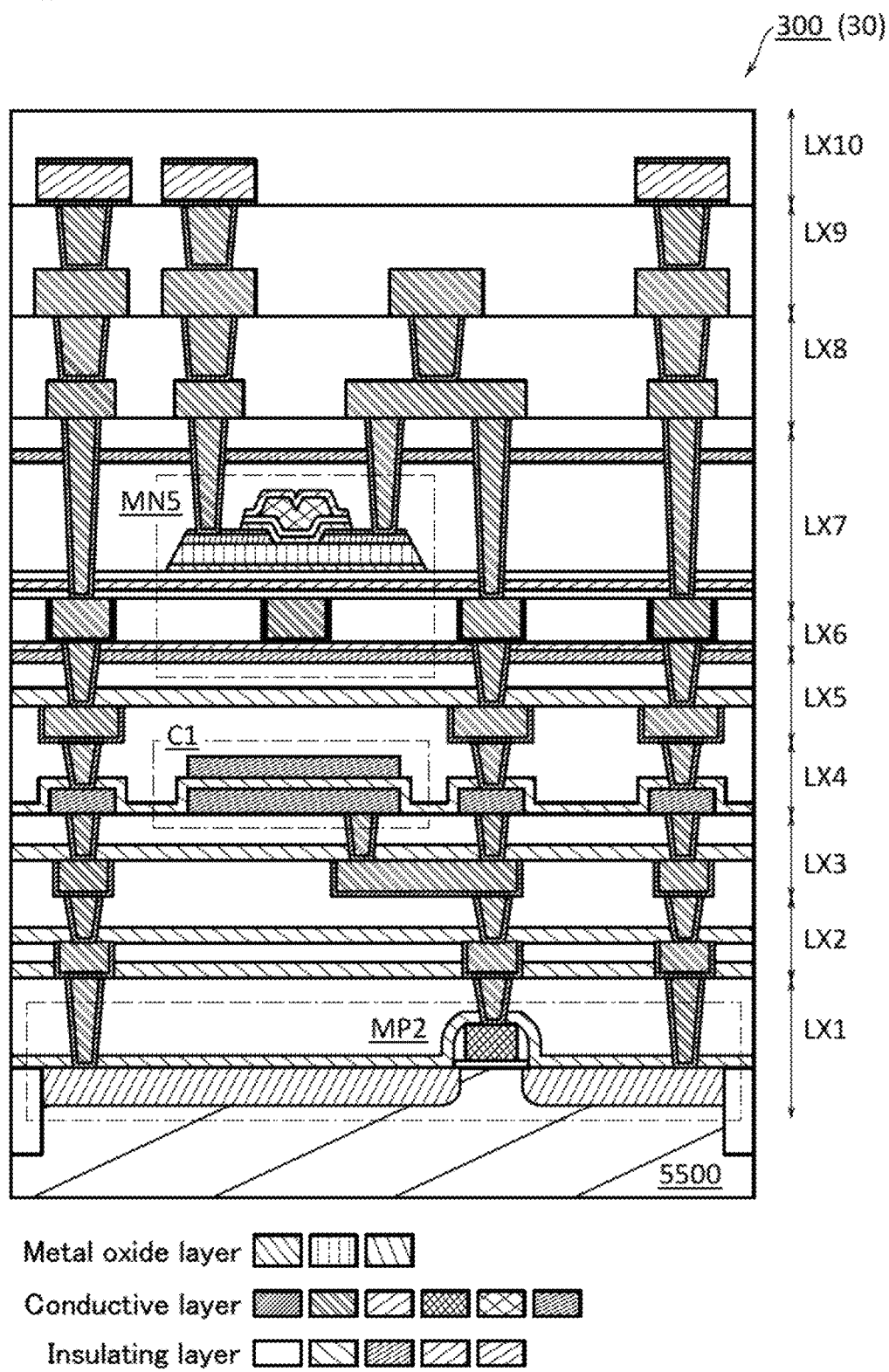
FIG. 21 is a cross-sectional view showing a stacked-layer structure of a NOSRAM.

Note that FIG. 20 and FIG. 21 are cross-sectional views for showing stacked-layer structures of the NOSRAM 300, and not cross-sectional views of the NOSRAM 300 taken along a specific line. Next, structure examples of the OS transistor are described with reference to FIGS. 22A and 22B.

<Structure Example 1 of OS Transistor>

Figure 22A:
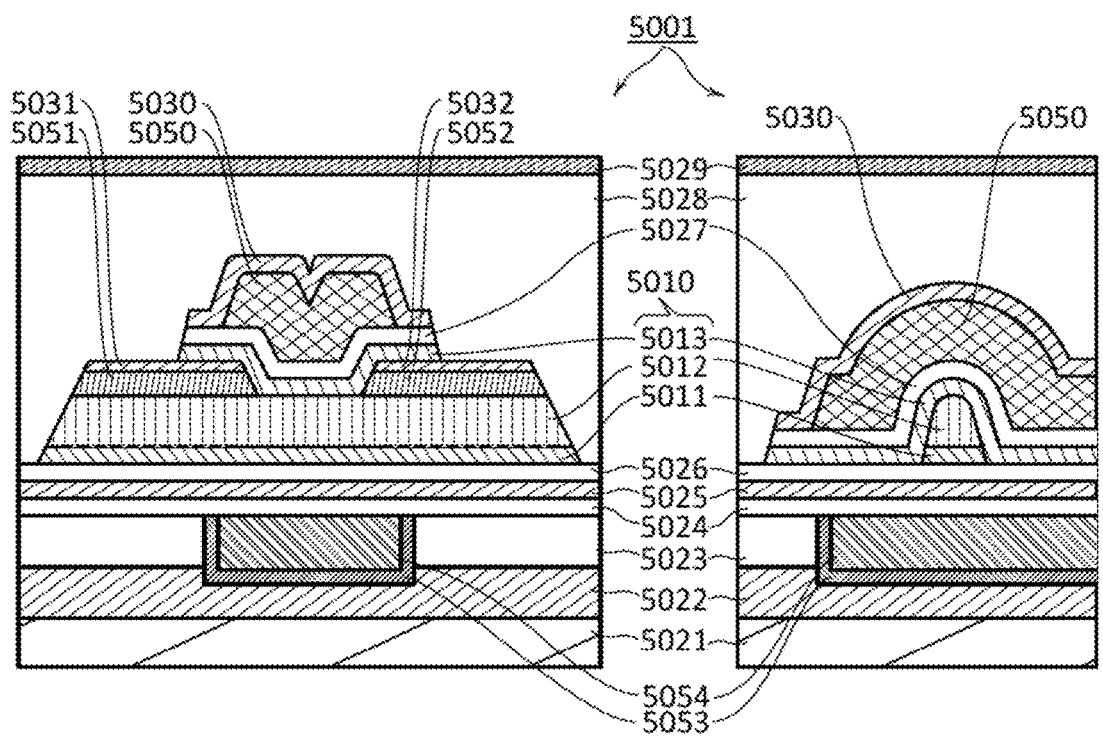
FIGS. 22A and 22B are cross-sectional views each illustrating a structure example of an OS transistor.

FIG. 22A illustrates a structure example of an OS transistor. The OS transistor 5001 in FIG. 22A is a metal oxide transistor. A cross-sectional view of the OS transistor 5001 in a channel length direction is illustrated on the left drawing of FIG. 22A, and a cross-sectional view of the OS transistor 5001 in a channel width direction is illustrated on the right drawing of FIG. 22A.

The OS transistor 5001 is formed over an insulating surface, here, over an insulating layer 5021. The OS transistor 5001 is covered with insulating layers 5028 and 5029. The OS transistor 5001 includes insulating layers 5022 to 5027 and 5030 to 5032, metal oxide layers 5011 to 5013, and conductive layers 5050 to 5054.

Note that an insulating layer, a metal oxide layer, a conductor, and the like in a drawing may have a single-layer structure or a stacked structure. These elements can be formed by any of a variety of deposition methods such as sputtering, molecular beam epitaxy (MBE), pulsed laser deposition (PLA), CVD, and atomic layer deposition (ALD). Examples of CVD include plasma-enhanced CVD, thermal CVD, and metal organic CVD.

The metal oxide layers 5011 to 5013 are collectively referred to as an oxide layer 5010. As illustrated in FIG. 22A, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is formed using the conductive layer 5050. A pair of electrodes that functions as a source electrode and a drain electrode of the OS transistor 5001 is formed using the conductive layers 5051 and 5052. The conductive layers 5050 to 5052 are covered with the insulating layers 5030 to 5032 that function as barrier layers. A back gate electrode of the OS transistor 5001 is formed using a stack of the conductive layers 5053 and 5054. The OS transistor 5001 does not necessarily include a back gate electrode. The same applies to an OS transistor 5002 to be described later.

A gate insulating layer on a gate (front gate) side is formed using the insulating layer 5027. A gate insulating layer on a back gate side is formed using a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 positioned therebetween.

Examples of a conductive material used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing the above metal as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or tungsten. Alternatively, in the case where the conductive layer 5050 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 5027 side.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 5051 has a two-layer structure or a three-layer structure, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 5027 side.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., tungsten). With such a structure, a stack of the conductive layer 5053 and the conductive layer 5054 functions as a wiring and has a function of suppressing diffusion of hydrogen into the oxide layer 5010.

Examples of insulating materials used for the insulating layers 5021 to 5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5032 are formed using a single-layer structure or a stacked structure of these insulating materials. The layers used for the insulating layers 5021 to 5032 may include a plurality of insulating materials.

Note that in this specification and the like, an oxynitride refers to a substance that contains more oxygen than nitrogen, and a nitride oxide refers to a substance that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 functions as a barrier layer and at least one of the insulating layers 5021, 5022, and 5024 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. A barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents oxidation of the conductive layer 5050. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

A structure example of the insulating layers 5021 to 5032 is described. In this example, each of the insulating layers 5021, 5022, 5025, 5029, and 5030 to 5032 functions as a barrier layer. The insulating layers 5026 to 5028 are oxide layers containing excess oxygen. The insulating layer 5021 is formed using silicon nitride. The insulating layer 5022 is formed using aluminum oxide. The insulating layer 5023 is formed using silicon oxynitride. The gate insulating layers (5024 to 5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 and 5030 to 5032 are formed using aluminum oxide.

FIG. 22A illustrates an example in which the oxide layer 5010 has a three-layer structure; however, one embodiment of the present invention is not limited thereto. For example, the oxide layer 5010 can have a two-layer structure without the metal oxide layer 5011 or 5013 or may be composed of one of the metal oxide layers 5011 and 5012. Alternatively, the oxide layer 5010 may be composed of four or more metal oxide layers.

<<Structure Example 2 of OS transistor>>

Figure 22B:
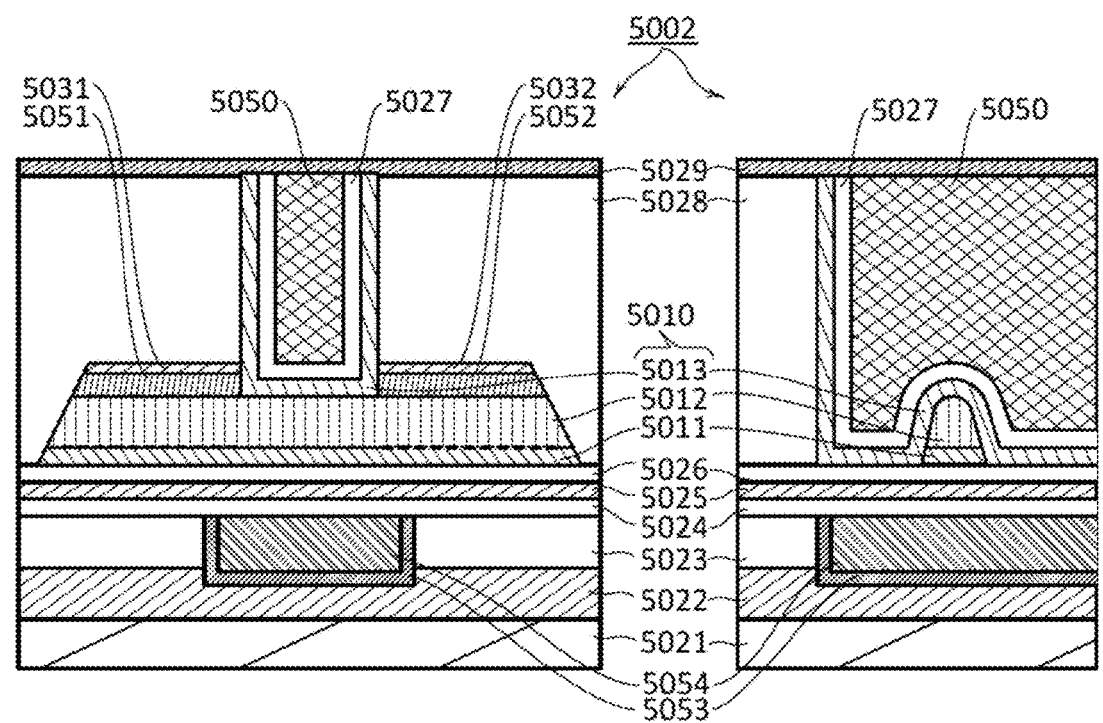

FIG. 22B illustrates a structure example of an OS transistor. The OS transistor 5002 in FIG. 22B is a modification example of the OS transistor 5001. The OS transistor 5002 differs from the OS transistor 5001 mainly in the structure of the gate electrode. A cross-sectional view of the OS transistor 5002 in a channel length direction is illustrated on the left drawing of FIG. 22B, and a cross-sectional view of the OS transistor 5002 in a channel width direction is illustrated on the right drawing of FIG. 22B.

The metal oxide layer 5013, the insulating layer 5027, and the conductive layer 5050 are provided in an opening portion formed in the insulating layer 5028. In other words, a gate electrode is formed in a self-aligning manner by using the opening portion of the insulating layer 5028. Thus, in the OS transistor 5002, a gate electrode (5050) does not include a region that overlaps with a source electrode or a drain electrode (5051 or 5052) with a gate insulating layer (5017) positioned therebetween. Accordingly, gate-source parasitic capacitance and gate-drain parasitic capacitance can be reduced and frequency characteristics can be improved. Furthermore, gate electrode width can be controlled by the opening portion of the insulating layer 5028; thus, it is easy to manufacture an OS transistor with short channel length.

A channel formation region of the OS transistor preferably includes a cloud-aligned composite oxide semiconductor (CAC-OS).

The CAC-OS has a conducting function in part of a material and has an insulating function in another part of the material; as a whole, the CAC-OS functions as a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the conducting function, and the insulating regions have the insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred in some cases.

Furthermore, in the CAC-OS, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS includes components having different bandgaps. For example, the CAC-OS includes a component having a wide gap due to an insulating region and a component having a narrow gap due to a conductive region. In the case of such a composition, carriers mainly flow in the component having a narrow gap. The component having a narrow gap complements the component having a wide gap, and carriers also flow in the component having a wide gap in conjunction with the component having a narrow gap.

Therefore, in the case where the CAC-OS is used in a channel formation region of a transistor, high current drive capability and high field-effect mobility of the OS transistor can be obtained.

A metal oxide semiconductor is classified into a single crystal metal oxide semiconductor and a non-single-crystal metal oxide semiconductor according to crystallinity. Examples of a non-single-crystal metal oxide semiconductor include a c-axis aligned crystalline oxide semiconductor (CAAC-OS), a polycrystalline oxide semiconductor, a nanocrystalline oxide semiconductor (nc-OS), and an amorphous-like oxide semiconductor (a-like OS).

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected.

The shape of the nanocrystal is basically a hexagon. However, the shape is not always a regular hexagon and is a non-regular hexagon in some cases. Pentagonal lattice arrangement, heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like.

The CAAC-OS tends to have a layered crystal structure (also referred to as a layered structure) in which a layer containing indium and oxygen (hereinafter referred to as an In layer) and a layer containing an element M, zinc, and oxygen (hereinafter referred to as an (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor depending on an analysis method.

The a-like OS has a structure between those of the nc-OS and the amorphous oxide semiconductor. The a-like OS has a void or a low-density region. The a-like OS has lower crystallinity than the nc-OS and the CAAC-OS.

In this specification and the like, a CAC refers to the function or material of a metal oxide semiconductor, and a CAAC refers to the crystal structure of a metal oxide semiconductor.

Example 1

In this example, the design, manufacturing process, performance, and the like of the NOSRAM in Embodiment 2 are described. Note that components similar to those in Embodiment 2 are not described in this example.

<<NOSRAM Memory Cell>>

A 1M-bit 2T1C-gain-cell NOSRAM was fabricated using a combination of a 60-nm OS-transistor process and a foundry 65-nm CMOS process. An OS transistor was fabricated using a crystalline In—Ga—Zn oxide. FIGS. 23A to 23D respectively show a circuit diagram of a memory cell of the fabricated NOSRAM, a circuit diagram of a replica cell, node bias conditions, and a timing chart.

The voltage VDD is a power supply voltage of a logic circuit and is 1.2 V. The voltage VWL is a high level voltage of the wordlines WWL and RWL and is 3.3 V. The voltage VSL is a high level voltage of the sourceline and is 1.6 V.

Figure 23C:
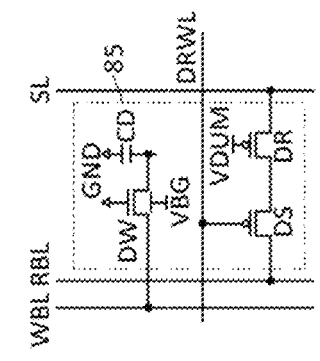
FIG. 23C shows node bias conditions in a memory cell and a replica cell.
Figures 23A, 23B:
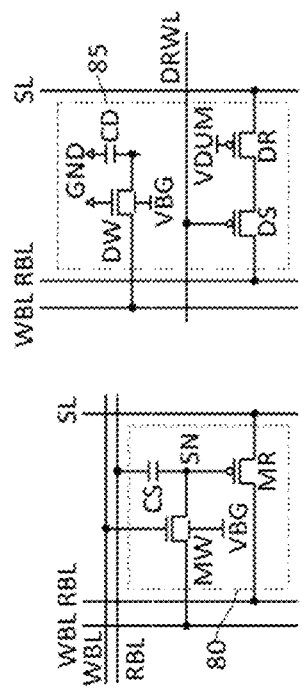
FIG. 23A is a circuit diagram of a memory cell in a fabricated NOSRAM macro.
FIG. 23B is a circuit diagram of a replica cell.
Figure 23D:
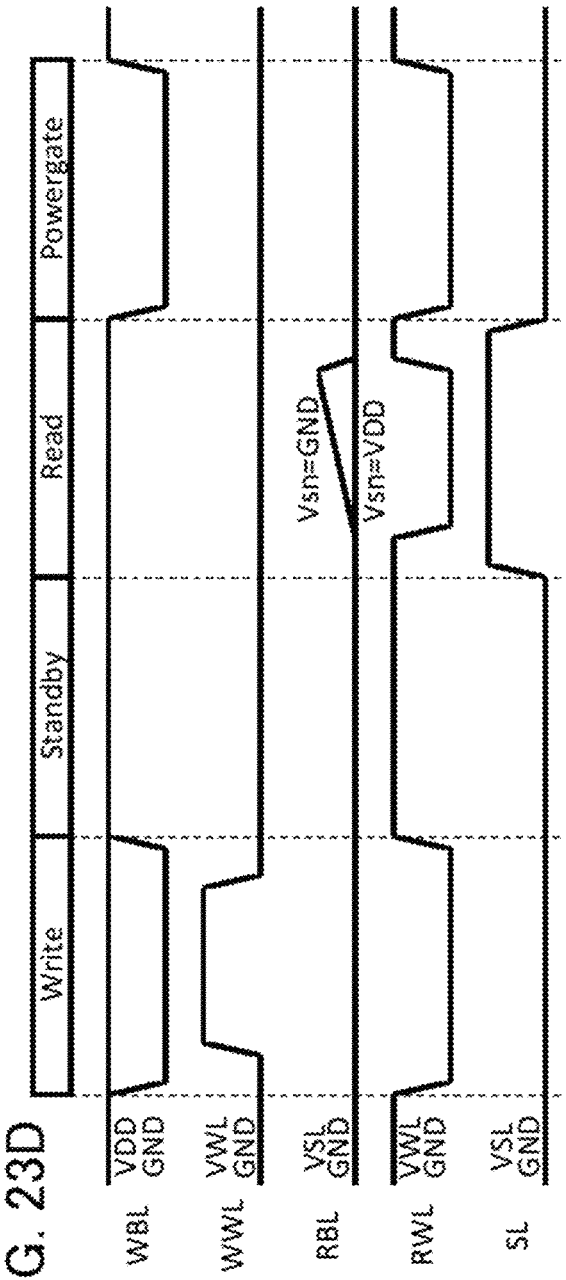
FIG. 23D is a timing chart of a memory cell.

A memory cell 80 is a 2T1C gain cell and includes an OS transistor MW, a Si transistor MR, a capacitor CS, and a node SN. Vsn in FIG. 23D is a voltage of the node SN. The OS transistor MW is a write transistor and includes a back gate. The Si transistor MR is a read transistor. The memory cell 80 is electrically connected to the wordlines WWL and RWL, the bitlines WBL and RBL, and the sourceline SL.

A storage node of a memory cell of the NOSRAM is charged through the OS transistor. Since the OS transistor has an extremely small off-state current, the OS transistor does not leak electric charges. In contrast, in a 65-nm CMOS logic process, the gate insulator thickness Tnx of the Si transistor is 2 nm to 3 nm. Eclectic charges stored in the storage node leak because of gate leakage when the thickness of a gate insulator of the read transistor. To reduce gate leakage, the NOSRAM has a thick gate insulator Si transistor as the Si transistor MR. The thick gate insulator Si transistor is provided for input/output (I/O) devices in a foundry's standard logic platform.

The storage capacitance of the NOSRAM can be reduced because a memory cell of the NOSRAM is a gain cell. Thus, the application of a 3D capacitor structure to the capacitor CS of the memory cell 80 is not necessary. The capacitor CS is an MIM capacitor with 0.92 fF. The reduction in storage capacitance leads to a shorter write time. Note that the storage time of the memory cell 80 is over 1 hour at 85° C. In addition, the memory cell 80 employs non-destructive reading, and thus it does not need rewriting in a read cycle, which leads to a shorter read time.

The replica cell 85 includes an OS transistor DW, Si transistors DR and DS, and a capacitor CD. The specifications of the OS transistor DW is the same as those of the OS transistor MW. The GND (ground potential) is input to a gate of the OS transistor DR. The capacitor CD is a 0.92-fF MIM capacitor like the capacitor CS.

The voltage VDUM is input to a gate of the Si transistor DR. A gate of the Si transistor DS is electrically connected to the wordline DRWL. The Si transistors DR and DS are Si transistors having thick gate insulators like the Si transistor MR.

The W (channel width)/L (channel length) of each of the OS transistors MW and DW are 60 nm/60 nm. The W/L of each of the Si transistors MR and DR is 320 nm/240 nm. The W/L of the Si transistor DS is 320 nm/400 nm.

Figure 24:
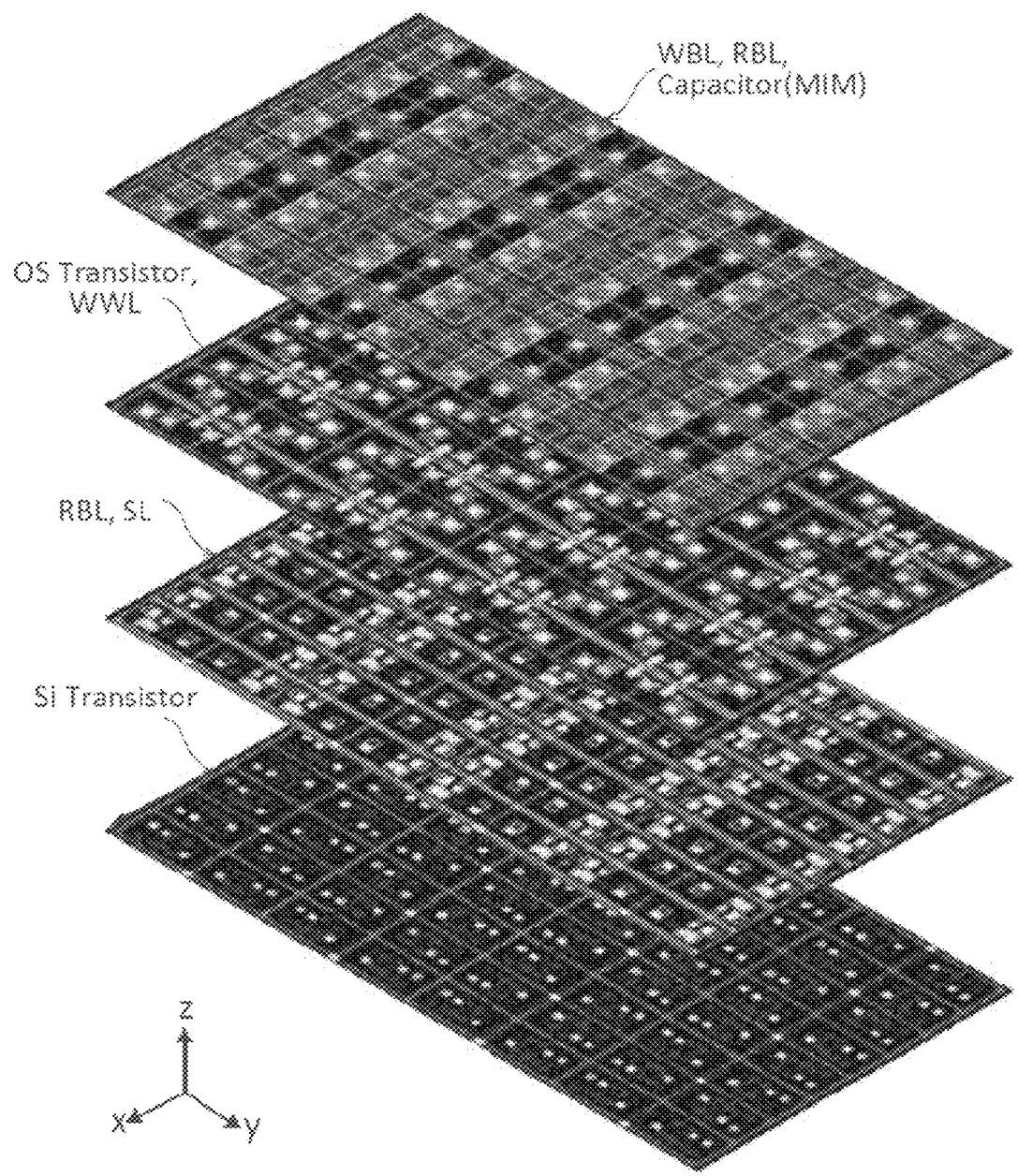
FIG. 24 is a deal drawing of a layout of memory cells.

FIG. 24 is a deal drawing of a layout of the memory cells 80. FIG. 24 illustrates 64 memory cells 80 (8 wordlines, 8 bitlines). The OS transistors MW and DW are stacked above the Si transistors MR, DR, and DS. The capacitors CS and CD are stacked above the OS transistors MW and DW.

<<Design and Characteristics of NOSRAM Macro>>

Figure 25:
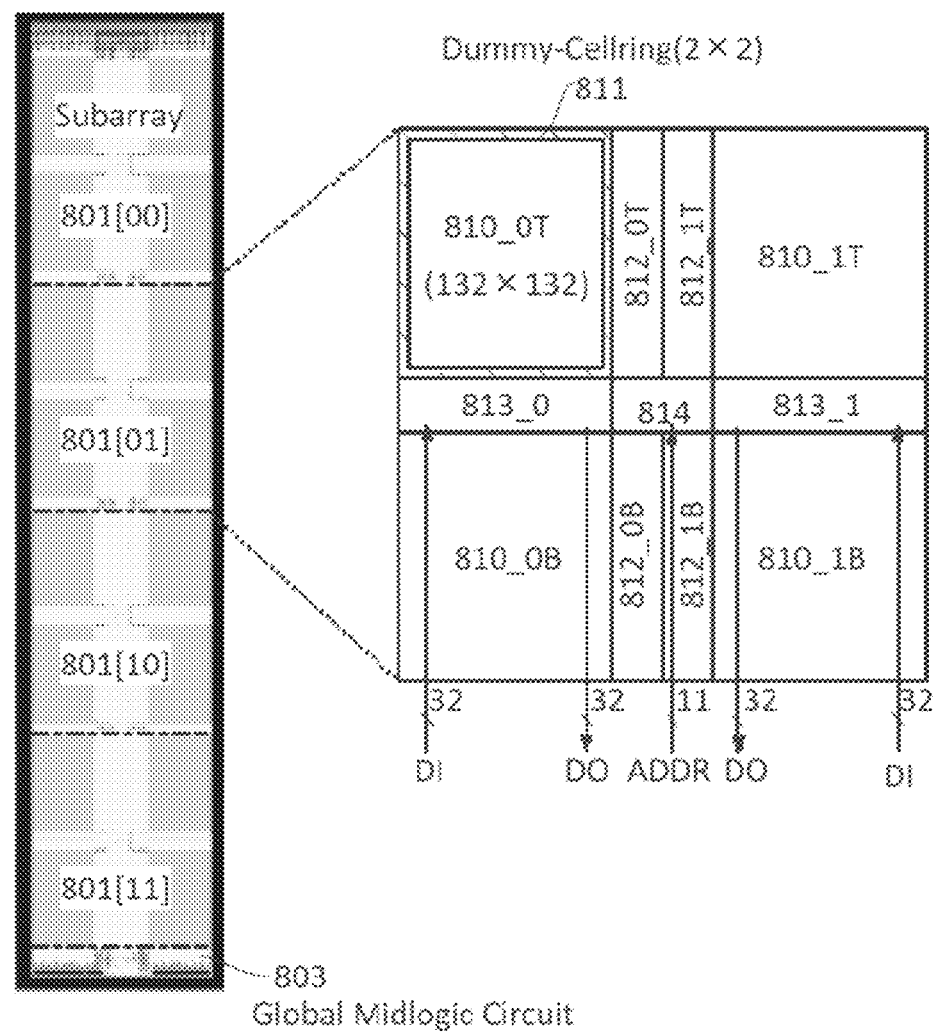
FIG. 25 shows the architecture of a NOSRAM macro.

FIG. 25 shows the architecture of a NOSRAM macro. A NOSRAM macro 800 shown in FIG. 25 includes 4 subarrays 801[00] to 801[11] and global midlogic circuits 803. The capacitance of the subarray 801 is 64 kbit.

The subarray 801 includes four memory cell arrays 810_0T, 810_1T, 810_0B, and 810_1B, four row circuits 812_0T, 812_1T, 812_0B, and 812_1B, two column circuits 813_0 and 813_1, and a local midlogic circuit 814. The memory cell arrays 810_0T and 810_0B share the column circuit 813_0. The memory cell arrays 810_1T and 810_1B share the column circuit 813_1. The capacitance of the memory cell array 810 is 16 kbit. The memory cell array 810 has a structure of 132 rows×132 columns including a dummy cell ring 811 of 2 rows×2 columns.

Figure 26A:
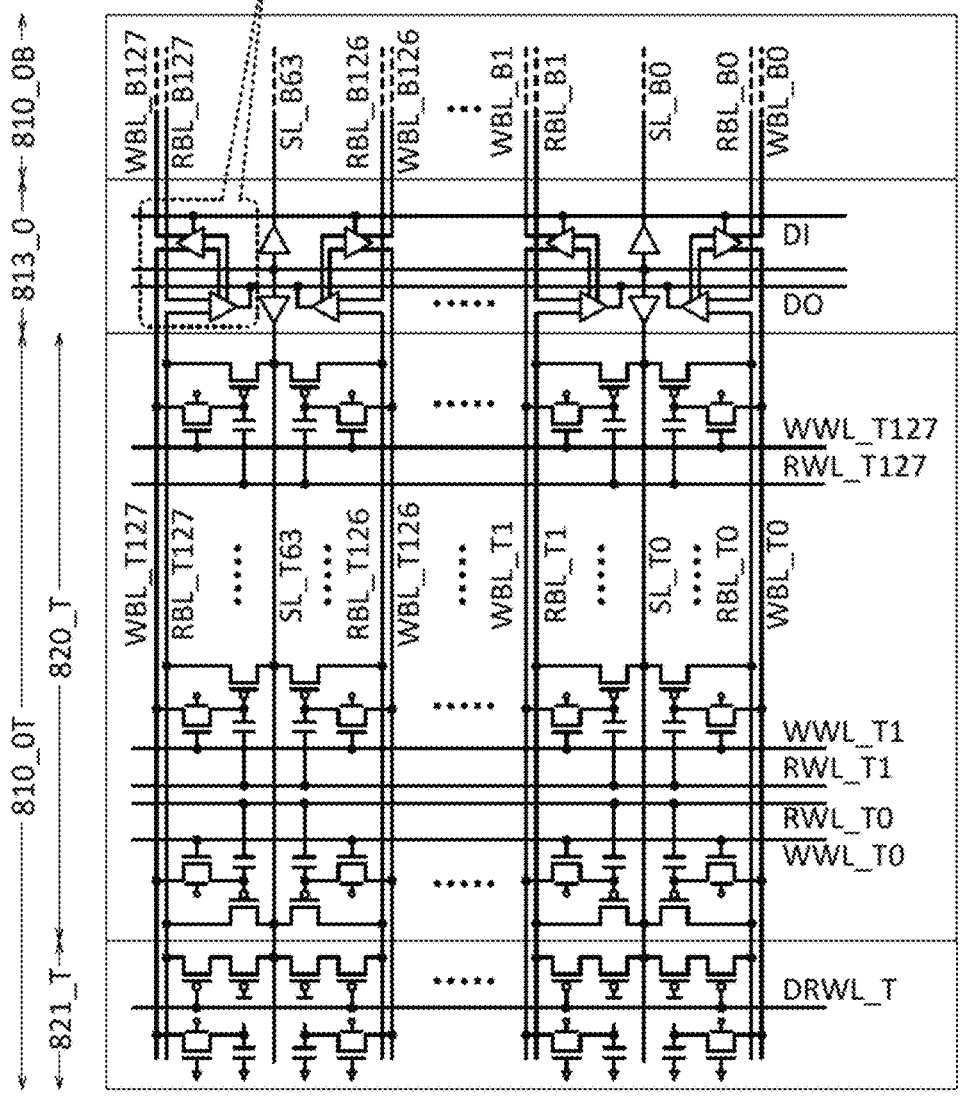
FIG. 26A shows a bitline structure of a subarray.
Figure 26B:
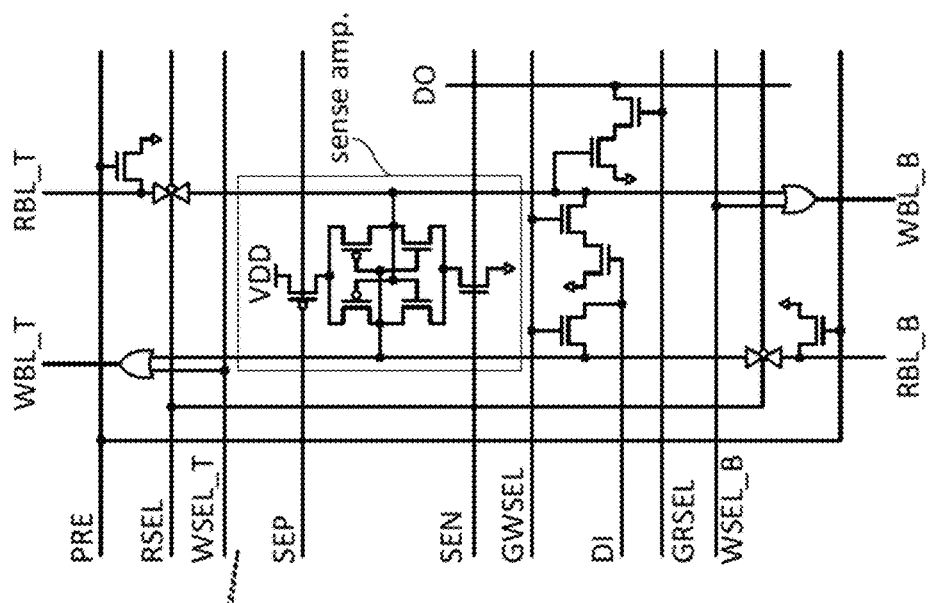
FIG. 26B is a circuit diagram of a column circuit.

FIG. 26A shows a bitline structure of the subarray 801. FIG. 26B shows a circuit structure of a main section of the column circuit 813_0.

The memory cell array 810_0T includes a cell array 820_T and a replica cell array 821_T. The dummy cell ring 811 is not shown in FIG. 26A. In the cell array 820_T, 128 memory cells 80 are provided for each bitline, and 128 memory cells 80 are provided for each wordline. The sourceline SL is shared by adjacent two columns.

In the conventional reading method, an external input voltage is used as a read judge voltage for data 0/1 judgment. In the novel reading method of this example, the read judge voltage is generated in a replica cell. The use of the replica cell shortens the time Tsns from when a read wordline is set to "L" to when sense amplifiers are activated. Generating the read judge voltage in each cell array results in robust read operation against PVT variations.

Each of the bitlines RBL_T and RBL_B has one replica cell 85. For example, when data in the memory cell array 810_0B is read, the wordline DRWL_T of the replica cell array 821_T is set to "L". Each of the 128 replica cells 85 in the replica cell array 821_T generates a reference signal. The reference signals are output to the bitlines RBL_T0 to RBL_T127. With the use of voltages of the bitlines RBL_T0 to RBL_T127 when the sense amplifiers are activated as read judge voltages, the column circuit 813_0 performs 0/1 judgment of data read to the bitlines RBL_B0 to RBL_B127.

A comparison of reading speed according to the present read scheme and the conventional read scheme was performed under different PVT (Process, Voltage, and Temperature) conditions through simulation. FIG. 27 shows the comparison results. The Tsns is estimated in a test bench of 64 k-bit subarrays 801. The results show that the present read scheme achieves high-speed operation and high robustness compared with the conventional read scheme. Note that a read judge voltage in the conventional scheme is 0.4 V.

<<1 Mbit NOSRAM>>

A 1 Mbit NOSRAM was fabricated using 65-nm-OS/60-nm-CMOS hybrid process. FIGS. 28A and 28B show a die micrograph of the fabricated NOSRAM and a cross-sectional micrograph of the memory cell, respectively. FIG. 28C shows specifications of the NOSRAM.

In the NOSRAM, a clock generator (CLK Gen.) and a memory built-in self-test block (MBIST) were provided. The 1 Mbit NOSRAM macro includes four NOSRAM macros 800. Nine metal wiring layers are formed at the back end of the lines (Back-End-Of-Line, BEOL).

Data retention in the NOSRAM exceeds 1 hour at 85° C. The maximum operation frequency was 140 MHz at room temperature. FIGS. 29A to 29C show Shmoo plots (Voltages VDD, VSL, and VWL vs operation frequency) in the temperature ranges of −40° C., 25° C., and 85° C. The 1 Mbit NOSRAM macro achieved a clock frequency of 130 MHz in the temperature range of −40° C. to 85° C. In other words, the NOSRAM is suitable for a wide range of uses.

The standby power and active power of the NOSRAM are 31 μW and 64 μW/MHz, respectively. The long-term data retention characteristics can reduce leakage current by power gating. Thus, the NOSRAM can be suitably used as an embedded memory of a device that requires high performance and low power.

REFERENCE NUMERALS

QS,QSb,SN: nodes,
C1,C3,CD,CS: capacitors,
DR2,DR4,DS,DS2,DS4,DW,DW2,MN1,MN2,MN3,MN5, MP2,MP3,MR3,MW3,M1,M2,M3,M 4,M5,M6,M7: transistors,
DW,MW: OS transistors,
MR: Si transistor,
BL,WBL,RBL,REFBL: bitlines,
WWL,RWL,DRWL: wordlines,
SL: sourceline,
PL,PLDUM,PLDDD,PLSSS,BGL: wirings,
10,11,12,13,14,30,80: memory cells,
20,21,22,23,35,85: replica cells,
25: read circuit, 26: write circuit, 27: selection circuit,
40,44: AND circuits, 41: level shifter, 42: butter circuit, 45: level shifter, 46: inverter circuit,
50: sense amplifier, 51,52: alalog switches, 53,54: OR circuits,
100: NOSRAM, 110: control circuit, 112: row circuit, 113: column circuit, 115,125: memory cell arrays, 116,126: replica cell arrays, 123: column circuit,
190, 191, 193: curved lines,
300,301,302: NOSRAMs, 310: control circuit, 312: row circuit, 313: column circuit, 315: predecoder, 320: column decoder, 321: precharge circuit, 322: sense amplifier, 324: write driver, 325: sourceline driver, 330: block, 335: replica cell array, 340: circuit, 350: subarray, 355: macro, 360: control circuit, 361: predecoder, 363: logic circuit, 370: control circuit, 371: predecoder,
400: MCU(micro controller unit), 405: bus, 410: processor core, 412: clock generation circuit, 413: PMU(power management unit), 415: peripheral circuit, 430: memory portion, 432: NOSRAM, 434: memory device,
800: NOSRAM macro, 801: subarray, 803: global midlogic circuit, 810,810_0T,810_1T,810_0B,810_1B: memory cell arrays, 811: dummy cell ring, 812_0T,812_1T, 812_0B,812_1B: row circuits, 813,813_0,813_1: column circuits, 814: global midlogic circuit, 820_T: local array, 821_T: replica cell array,
2010: information terminal, 2011: housing, 2012: display portion, 2013: operation button, 2014: external connection port, 2015: speaker, 2016: microphone, 2051: housing, 2052: display portion, 2053: key board, 2054: pointing device, 2070: video camera, 2071: housing, 2072: display portion, 2073: housing, 2074: operation key, 2075: lense, 2076: joint,
2110: portable game machine, 2111: housing, 2112: display portion, 2113: speaker, 2114: LED lamp, 2115: operation key buttons, 2116: connection terminal, 2117: camera, 2118: microphone, 2119: recording medium read portion, 2150: electric refrigerator-freezer, 2151: housing, 2152: refrigerator door, 2153: freezer door, 2170: motor vehicle, 2171: car body, 2172: wheels, 2173: dashboard, 2174: lights,
5001,5002: OS transistors, 5010: oxide layer, 5011,5012, 5013: metal oxide layers, 5021,5022,5023,5024,5025, 5026,5027,5028,5029,5030,5031,5032: insulating layers, 5050,5051,5052,5053,5054: conductive layers, 5500: single crystal silicon wafer, LX1,LX2,LX3,LX4,LX5, LX6,LX7,LX8,LX9,LX10: layer,
7000: electronic component, 7001: lead, 7002: printed circuit board, 7004: circuit board, 7110: chip This application is based on Japanese Patent Application Serial No. 2016-177842 filed with Japan Patent Office on Sep. 12, 2016 and Japanese Patent Application Serial No. 2017-050193 filed with Japan Patent Office on Mar. 15, 2017, the entire contents of which are hereby incorporated by reference.

The invention claimed is:

1. A memory device comprising:
a first cell;
a second cell;
a third cell;
a fourth cell;
a read circuit;
a first wordline;
a second wordline;
a third wordline;
a first bitline;
a second bitline;
a third bitline;
a fourth bitline;
a fifth bitline;
a sixth bitline;
a first sourceline;
a second sourceline; and
a first wiring,
wherein the first cell includes a first transistor and a second transistor,
wherein a gate, a first terminal, and a second terminal of the first transistor are electrically connected to the third wordline, the third bitline, and a first terminal of the second transistor, respectively,
wherein a gate and a second terminal of the second transistor are electrically connected to the first wiring and the first sourceline, respectively,
wherein the second cell includes a third transistor, a fourth transistor, and a first capacitor,
wherein a gate, a first terminal, and a second terminal of the third transistor are electrically connected to the first wordline, the first bitline, and a gate of the fourth transistor, respectively,
wherein a first terminal and a second terminal of the first capacitor are electrically connected to the gate of the fourth transistor and the second wordline, respectively,
wherein a first terminal and a second terminal of the fourth transistor are electrically connected to the first sourceline and the second bitline, respectively,
wherein the third cell includes a fifth transistor and a sixth transistor,
wherein a gate, a first terminal, and a second terminal of the fifth transistor are electrically connected to the third wordline, the sixth bitline, and a first terminal of the sixth transistor, respectively,
wherein a gate and a second terminal of the sixth transistor are electrically connected to the first wiring and the second sourceline, respectively,
wherein the fourth cell includes a seventh transistor, an eighth transistor, and a second capacitor,
wherein a gate, a first terminal, and a second terminal of the seventh transistor are electrically connected to the first wordline, the fourth bitline, and a gate of the eighth transistor, respectively, wherein a first terminal and a second terminal of the second capacitor are electrically connected to the gate of the eighth transistor and the second wordline, respectively, wherein a first terminal and a second terminal of the eighth transistor are electrically connected to the second sourceline and the fifth bitline, respectively, wherein the first transistor, the second transistor, and the fourth transistor are the same in conductivity type, and wherein the read circuit compares a potential of the third bitline with a potential of the second bitline and outputs a potential based on the comparison result.

2. The memory device according to claim 1, wherein a channel formation region of the third transistor includes a metal oxide.

3. A semiconductor device comprising:
a processor core;
a memory portion; and
a bus,
wherein the memory portion comprises the memory device according to claim 1, and
wherein a signal and data are transferred between the processor core and the memory portion through the bus.

4. The semiconductor device according to claim 3,
wherein the memory portion includes at least one of a DRAM, an SRAM, a flash memory, a ferroelectric RAM, a magnetoresistive RAM, a resistance RAM, and a phase change RAM.

5. A memory device comprising:
a first memory cell array;
a second memory cell array; and
a column circuit,
the first memory cell array comprising:
  a first cell;
  a second cell;
  a first wordline;
  a second wordline;
  a third wordline;
  a first bitline;
  a second bitline;
  a first sourceline; and
  a first wiring,
the second memory cell array comprising:
  a third cell;
  a fourth cell;
  a fourth wordline;
  a fifth wordline;
  a sixth wordline;
  a third bitline;
  a fourth bitline;
  a second sourceline; and
  a second wiring,
wherein the column circuit is electrically connected to the first bitline, the second bitline, the first sourceline, the third bitline, the fourth bitline, and the second sourceline, wherein the column circuit includes a sense amplifier, a first circuit, a second circuit, a third circuit, and a fourth circuit, wherein the sense amplifier includes a first node and a second node, wherein the first circuit is configured to control electrical continuity between the second bitline and the second node, wherein the second circuit is configured to control electrical continuity between the fourth bitline and the first node, wherein the third circuit is configured to control electrical continuity between the first bitline and the first node, wherein the fourth circuit is configured to control electrical continuity between the third bitline and the second node, wherein the first cell includes a first transistor and a second transistor, wherein a gate, a first terminal, and a second terminal of the first transistor are electrically connected to the third wordline, the second bitline, and a first terminal of the second transistor, respectively, wherein a gate and a second terminal of the second transistor are electrically connected to the first wiring and the first sourceline, respectively, wherein the third cell includes a third transistor and a fourth transistor, wherein a gate, a first terminal, and a second terminal of the third transistor are electrically connected to the sixth wordline, the fourth bitline, and a first terminal of the fourth transistor, respectively, wherein a gate and a second terminal of the fourth transistor are electrically connected to the second wiring and the second sourceline, respectively, wherein the second cell includes a fifth transistor, a sixth transistor, and a first capacitor, wherein a gate, a first terminal, and a second terminal of the fifth transistor are electrically connected to the first wordline, the first bitline, and a gate of the sixth transistor, respectively, wherein a first terminal and a second terminal of the first capacitor are electrically connected to the gate of the sixth transistor and the second wordline, respectively, wherein a first terminal and a second terminal of the sixth transistor are electrically connected to the first sourceline and the second bitline, respectively, wherein the fourth cell includes a seventh transistor, an eighth transistor, and a second capacitor, wherein a gate, a first terminal, and a second terminal of the seventh transistor are electrically connected to the fourth wordline, the third bitline, and a gate of the eighth transistor, respectively, wherein a first terminal and a second terminal of the second capacitor are electrically connected to the gate of the eighth transistor and the fifth wordline, respectively, wherein a first terminal and a second terminal of the eighth transistor are electrically connected to the second sourceline and the fourth bitline, respectively, and wherein the first transistor, the second transistor, the sixth transistor, and the eighth transistor are the same in conductivity type.

6. The memory device according to claim 5, wherein a channel formation region of the seventh transistor includes a metal oxide.

7. A semiconductor device comprising:
a processor core;
a memory portion; and
a bus,
wherein the memory portion comprises the memory device according to claim 5, and
wherein a signal and data are transferred between the processor core and the memory portion through the bus.

8. The semiconductor device according to claim 7, wherein the memory portion includes at least one of a DRAM, an SRAM, a flash memory, a ferroelectric RAM, a magnetoresistive RAM, a resistance RAM, and a phase change RAM.

* * * * *